US012035508B2

(12) United States Patent
Enright et al.

(10) Patent No.: US 12,035,508 B2
(45) Date of Patent: Jul. 9, 2024

(54) LIQUID IMMERSION COOLING PLATFORM AND COMPONENTS THEREOF

(71) Applicant: MODINE LLC, Racine, WI (US)

(72) Inventors: John David Enright, Plano, TX (US); Raquel Parker, Plano, TX (US); Darshan Patell, Plano, TX (US); Randall Coburn, Plano, TX (US); Josh Haley, Plano, TX (US); Ryan Graham, Plano, TX (US); Jason Erickson, Plano, TX (US); Jacob Mertel, Plano, TX (US); Taylor Monnig, Plano, TX (US); Brian Haught, Plano, TX (US); Ryan Myre, Plano, TX (US); William Bret Boren, Plano, TX (US); Andrew Downs, Plano, TX (US); Dustin Yeatman, Plano, TX (US); Edward King, Plano, TX (US); Rick Margerison, Plano, TX (US); Jimil M. Shah, Plano, TX (US); William Hadala, Plano, TX (US); Josh Whitaker, Plano, TX (US); Seamus Egan, Plano, TX (US); Brad Furnish, Plano, TX (US); Tim Tomlin, Plano, TX (US)

(73) Assignee: Modine LLC, Racine, WI (US)

( * ) Notice: Subject to any disclaimer, the term of this patent is extended or adjusted under 35 U.S.C. 154(b) by 0 days.

(21) Appl. No.: 17/837,906

(22) Filed: Jun. 10, 2022

(65) Prior Publication Data

US 2022/0400584 A1 Dec. 15, 2022
US 2023/0180439 A9 Jun. 8, 2023

Related U.S. Application Data

(63) Continuation-in-part of application No. 17/136,474, filed on Dec. 29, 2020.
(Continued)

(51) Int. Cl.
*H05K 7/20* (2006.01)
(52) U.S. Cl.
CPC ......... *H05K 7/20381* (2013.01); *H05K 7/203* (2013.01); *H05K 7/20327* (2013.01); *H05K 7/20818* (2013.01); *H05K 7/20836* (2013.01)
(58) Field of Classification Search
None
See application file for complete search history.

(56) References Cited

U.S. PATENT DOCUMENTS 5,624,580 A 4/1997 De Hoxar
7,213,391 B2 5/2007 Jones
(Continued)

FOREIGN PATENT DOCUMENTS

CN 102342191 A 2/2012
CN 105762437 A 7/2016
(Continued)

OTHER PUBLICATIONS

International Search Report and Written opinion dated Sep. 8, 2022 issued in PCT/US2022/33063.
(Continued)

*Primary Examiner* — Courtney L Smith
(74) *Attorney, Agent, or Firm* — Michael Best & Friedrich LLP

(57) ABSTRACT

An immersion cooling system and methods for operating the system are described. The system can comprise a vessel configured to hold thermally conductive, condensable dielectric fluid; a pressure controller to reduce or increase an
(Continued)

interior pressure of the vessel; a computer component configured to be at least partially submerged within the dielectric fluid; and a fluid circulation system configured to draw the dielectric fluid from a sump area of the vessel, pass the dielectric fluid through a filter and deliver the dielectric fluid to a bath area of the vessel.

15 Claims, 21 Drawing Sheets

Related U.S. Application Data

(60) Provisional application No. 63/278,330, filed on Nov. 11, 2021, provisional application No. 63/278,365, filed on Nov. 11, 2021, provisional application No. 63/278,358, filed on Nov. 11, 2021, provisional application No. 63/278,312, filed on Nov. 11, 2021, provisional application No. 63/278,167, filed on Nov. 11, 2021, provisional application No. 63/278,178, filed on Nov. 11, 2021, provisional application No. 63/278,175, filed on Nov. 11, 2021, provisional application No. 63/278,223, filed on Nov. 11, 2021, provisional application No. 63/209,258, filed on Jun. 10, 2021.

(56) References Cited

U.S. PATENT DOCUMENTS

| | | | |
|---|---|---|---|
| 7,885,070 B2 | 2/2011 | Campbell et al. | |
| 7,957,145 B2 | 6/2011 | Suzuki et al. | |
| 7,961,475 B2 | 6/2011 | Campbell et al. | |
| 8,009,419 B2 | 8/2011 | Attlesey et al. | |
| 8,014,150 B2 | 9/2011 | Campbell et al. | |
| 8,089,765 B2 | 1/2012 | Attlesey | |
| 8,194,406 B2 | 6/2012 | Campbell et al. | |
| 8,208,258 B2* | 6/2012 | Campbell | H05K 7/2079 |
| | | | 361/698 |
| 8,351,206 B2 | 1/2013 | Campbell et al. | |
| 8,490,418 B2 | 7/2013 | Weber et al. | |
| 8,711,565 B2 | 4/2014 | Wagoner et al. | |
| 8,867,209 B2 | 10/2014 | Campbell et al. | |
| 8,941,994 B2 | 1/2015 | Campbell et al. | |
| 8,947,873 B2 | 2/2015 | Campbell et al. | |
| 8,953,317 B2 | 2/2015 | Campbell et al. | |
| 8,953,320 B2 | 2/2015 | Campbell et al. | |
| 8,964,391 B2 | 2/2015 | Campbell et al. | |
| 8,966,922 B2 | 3/2015 | Campbell et al. | |
| 8,976,526 B2 | 3/2015 | Kulkarni et al. | |
| 9,049,800 B2 | 6/2015 | Shelnutt et al. | |
| 9,095,942 B2 | 8/2015 | Campbell et al. | |
| 9,101,078 B2 | 8/2015 | Campbell et al. | |
| 9,144,179 B2 | 9/2015 | Shelnutt et al. | |
| 9,153,374 B2 | 10/2015 | Kulkarni et al. | |
| 9,178,400 B2 | 11/2015 | Pal et al. | |
| 9,195,282 B2 | 11/2015 | Shelnutt et al. | |
| 9,223,360 B2 | 12/2015 | Attlesey et al. | |
| 9,261,308 B2 | 2/2016 | Campbell et al. | |
| 9,282,678 B2 | 3/2016 | Campbell et al. | |
| 9,313,920 B2 | 4/2016 | Campbell et al. | |
| 9,328,964 B2 | 5/2016 | Shelnutt et al. | |
| 9,332,674 B2 | 5/2016 | Campbell et al. | |
| 9,351,429 B2 | 5/2016 | Shelnutt et al. | |
| 9,357,675 B2 | 5/2016 | Campbell et al. | |
| 9,414,520 B2 | 8/2016 | Campbell et al. | |
| 9,433,132 B2 | 8/2016 | Krishnan et al. | |
| 9,516,792 B2 | 12/2016 | Krishnan et al. | |
| 9,543,787 B2 | 1/2017 | Scrutiny | |
| 9,596,787 B1 | 3/2017 | Iyengar et al. | |
| 9,622,379 B1 | 4/2017 | Campbell et al. | |
| 9,655,279 B2 | 5/2017 | Pelletier et al. | |
| 9,713,290 B2 | 7/2017 | James et al. | |
| 9,773,526 B2 | 9/2017 | Shelnutt et al. | |
| 9,904,811 B2 | 2/2018 | Campbell et al. | |
| 9,912,021 B2 | 3/2018 | Andres | |
| 9,913,402 B2 | 3/2018 | Shafer et al. | |
| 9,918,408 B2 | 3/2018 | Regimbal et al. | |
| 9,921,622 B2 | 3/2018 | Shelnutt et al. | |
| 9,974,212 B2 | 5/2018 | Ichinose et al. | |
| 9,992,914 B2 | 6/2018 | Best et al. | |
| 10,015,905 B2 | 7/2018 | Watanabe et al. | |
| 10,018,425 B2 | 7/2018 | Shelnutt et al. | |
| 10,020,242 B2 | 7/2018 | Katsumata et al. | |
| 10,028,409 B1 | 7/2018 | Metzler et al. | |
| 10,070,558 B2 | 9/2018 | Campbell et al. | |
| 10,098,260 B2 | 10/2018 | Bouras et al. | |
| 10,104,814 B2 | 10/2018 | Wagoner et al. | |
| 10,130,008 B2 | 11/2018 | Shepard et al. | |
| 10,149,408 B2 | 12/2018 | Fujiwara et al. | |
| 10,206,307 B2 | 2/2019 | Lau | |
| 10,206,308 B2 | 2/2019 | Meijer et al. | |
| 10,257,960 B1 | 4/2019 | Banerjee et al. | |
| 10,321,603 B1 | 6/2019 | Banerjee et al. | |
| 10,485,137 B2 | 11/2019 | Helsel et al. | |
| 10,512,192 B2 | 12/2019 | Miyoshi | |
| 10,568,236 B2 | 2/2020 | Tian et al. | |
| 10,609,839 B1 | 3/2020 | Archer et al. | |
| 10,624,242 B2* | 4/2020 | Best | G06F 1/20 |
| 10,750,637 B1* | 8/2020 | Alissa | H05K 7/203 |
| 10,765,033 B1 | 9/2020 | Keehn et al. | |
| 10,966,349 B1 | 3/2021 | Lau | |
| 10,969,842 B2* | 4/2021 | Enright | H05K 7/1492 |
| 11,076,508 B2 | 7/2021 | Gao | |
| 11,116,113 B2 | 9/2021 | Chiu et al. | |
| 11,277,938 B1* | 3/2022 | Enright | H05K 7/203 |
| 11,357,131 B1* | 6/2022 | Enright | H05K 7/20327 |
| 11,510,346 B2 | 11/2022 | Shao et al. | |
| 2006/0060381 A1 | 3/2006 | Heathman et al. | |
| 2008/0104970 A1 | 5/2008 | Suzuki et al. | |
| 2010/0103618 A1* | 4/2010 | Campbell | H05K 7/20772 |
| | | | 361/699 |
| 2010/0226094 A1* | 9/2010 | Attlesey | H05K 7/20772 |
| | | | 361/699 |
| 2010/0246118 A1 | 9/2010 | Attlesey | |
| 2011/0075118 A1 | 3/2011 | Jacobs et al. | |
| 2012/0167610 A1* | 7/2012 | Dunnavant | F28C 1/16 |
| | | | 62/428 |
| 2012/0168119 A1* | 7/2012 | Dunnavant | H05K 7/20745 |
| | | | 165/59 |
| 2013/0021752 A1 | 1/2013 | Campbell et al. | |
| 2013/0091866 A1 | 4/2013 | Campbell et al. | |
| 2014/0218858 A1 | 8/2014 | Shelnutt et al. | |
| 2014/0218859 A1 | 8/2014 | Shelnutt et al. | |
| 2015/0247679 A1 | 9/2015 | Niimi et al. | |
| 2017/0013744 A1 | 1/2017 | Shelnutt et al. | |
| 2018/0042138 A1 | 2/2018 | Campbell et al. | |
| 2018/0120194 A1 | 5/2018 | Roth | |
| 2019/0267683 A1 | 8/2019 | Shepard et al. | |
| 2019/0357378 A1 | 11/2019 | Kolar et al. | |
| 2020/0093025 A1* | 3/2020 | Enright | B25J 11/00 |
| 2020/0093037 A1* | 3/2020 | Enright | H05K 7/20381 |
| 2020/0113083 A1 | 4/2020 | Schon et al. | |
| 2020/0178414 A1 | 6/2020 | Bulinski et al. | |
| 2020/0386488 A1 | 12/2020 | Smith et al. | |
| 2021/0018356 A1 | 1/2021 | Bean, Jr. et al. | |
| 2021/0059079 A1 | 2/2021 | Keehn et al. | |
| 2021/0084790 A1 | 3/2021 | Sachdev et al. | |
| 2021/0120705 A1* | 4/2021 | Enright | H05K 7/203 |
| 2021/0180874 A1 | 6/2021 | Eadelson | |

FOREIGN PATENT DOCUMENTS

| | | |
|---|---|---|
| CN | 107564593 A | 1/2018 |
| CN | 108353517 A | 7/2018 |
| CN | 108375144 A | 8/2018 |
| JP | 2017050548 A | 3/2017 |
| JP | 2018010980 A | 1/2018 |
| TW | 201017087 A | 5/2010 |
| WO | 2013022805 A1 | 2/2013 |
| WO | 2017070867 A1 | 5/2017 |
| WO | 2018163180 A1 | 9/2018 |

(56) References Cited

FOREIGN PATENT DOCUMENTS

| WO | 2019138176 A1 | 7/2019 |
| WO | 2020102090 A1 | 5/2020 |
| WO | 2020225649 A1 | 11/2020 |
| WO | 2021111296 A1 | 6/2021 |
| WO | 2019155179 A1 | 8/2022 |

OTHER PUBLICATIONS

Chinese Patent Office Third Action for Application No. 201980089348.3 dated Dec. 22, 2023 (16 pages including English translation).
Chinese Patent Office First Office Action for Application No. 201980089348.3 dated Apr. 21, 2023 (16 pages including English translation).
Chinese Patent Office Supplementary Search Report for Application No. 201980089348.3 issued on Dec. 22, 2023 (1 page).
Chinese Patent Office Supplementary Search Report for Application No. 201980089348.3 issued Sep. 25, 2023 (1 page).
Chinese Patent Office First Search Report for Application No. 201980089348.3 issued Apr. 21, 2023 (2 pages).
Chinese Patent Office Second Office Action for Application No. 201980089348.3 issued on Sep. 25, 2023 (14 pages).
Taiwanese Patent Office Decision of Rejection for Application No. 108133797 dated May 15, 2024 (6 pages with English Statement of Relevance).
Mexican Patent Office Action for Application No. MX/a/2021/003176 dated Apr. 11, 2024 (9 pages with English Statement of Relevance).

\* cited by examiner

LIQUID IMMERSION COOLING PLATFORM AND COMPONENTS THEREOF

CROSS-REFERENCE TO RELATED APPLICATIONS

This application is related to PCT publication WO2020/102090 filed Nov. 11, 2019 titled "Liquid Immersion Cooling Platform" owned by TMGCore, LLC which application is incorporated herein by reference. This application is also a continuation-in-part of U.S. patent application Ser. No. 17/136,474 filed Dec. 29, 2020 titled "Hydrofire Rods For Liquid Immersion Cooling Platform" owned by TMGCore, LLC which application is incorporated herein by reference. This application also relates to the U.S. provisional application Ser. Nos. 63/209,258, 63/278,223, 63/278,175, 63/278,178, 63/278,167, 63/278,312, 63/278,358, 63/278,365, and 63/278,330.

FIELD OF DISCLOSURE

The present disclosure relates to a liquid immersion cooling system adapted to house computing devices, for example, a liquid immersion cooling system including a control system for optimizing the temperature of the system and the computing devices therein.

BACKGROUND

Traditional computing and/or server systems utilize air to cool the various components of these systems. Traditional liquid or water cooled computers utilize a flowing liquid to draw heat from computer components but avoid direct contact between the computer components and the liquid itself. The development of electrically non-conductive and/or dielectric fluid enables the use of immersion cooling in which computer components and other electronics may be submerged in a dielectric or electrically non-conductive liquid in order to draw heat directly from the component into the liquid. Immersion cooling can be used to reduce the total energy needed to cool computer components and may also reduce the amount of space and equipment necessary for adequate cooling.

SUMMARY

The liquid immersion cooling systems are being implemented for various computing needs. As such, it is beneficial to describe an immersion cooling system which can be easily adapted for every power, signal, data and fluid input and output hardware specification.

Advantageously, the instant application pertains to an exemplary immersion cooling system and methods for operating the system. In one example embodiment, the system can comprise a vessel configured to hold thermally conductive, condensable dielectric fluid; a pressure controller to reduce or increase an interior pressure of the vessel; a computer component configured to be at least partially submerged within the dielectric fluid; and a fluid circulation system configured to draw the dielectric fluid from a sump area of the vessel, pass the dielectric fluid through a filter and deliver the dielectric fluid to a bath area of the vessel.

In one example embodiment, the system can comprise an inlet for receiving the dielectric fluid from a source outside of the vessel. In one example embodiment, the system can comprise a valve system for connecting or disconnecting the fluid circulation system to the inlet. In one example embodiment, the fluid circulation system can include a pump. In one example embodiment, the system can comprise a management system configured to: direct the valve system to operate in a first mode of operation in which the pump is connected to the inlet; and direct the pump to draw dielectric fluid from the source. In one example embodiment, the system can comprise a retractable hose including a sensor for detecting whether the retractable hose is connected to the source.

In one example embodiment, the management system is configured to direct the pump to draw the dielectric fluid from the source only if the retractable hose is connected to the source. In one example embodiment, the system can comprise a management system configured to: direct the valve system to operate in a second mode of operation in which the pump is connected to the sump area; and direct the pump to draw fluid from the source.

In one example embodiment, the system can comprise a pressure controller that includes a heat exchanger comprising a plurality of pipes and at least one box. In one example embodiment, the pressure controller can include a heat exchanger comprising a plurality of pipes and at least one box. In one example embodiment, at least one of the plurality of pipes or the at least one box can include a vibration damper. In one example embodiment, the vibration damper can be a metallic weight.

In one example embodiment, the system can comprise a plurality of sensors and a management system configured to: receive sensor data relating to a temperature of the computer component; and determine a failure of the filter based on the temperature of the computer component. In one example embodiment, the sensor data can include: a temperature of the computer component, a power consumption at the vessel, an outside temperature, a dielectric fluid temperature, a temperature of incoming cooling medium, a temperature of outgoing cooling medium, a flow rate of a cooling medium, a temperature of an area above the bath area, a number of computer components present in the vessel, or a location of each computer component within the vessel.

In one example embodiment, the management system can be configured to determine whether the computer component is overheating using a machine learning model. In one example embodiment, the machine learning model can be trained using the sensor data received from the vessel.

In one example embodiment, the pressure controller includes a bellows configured to receive dielectric vapor. In one example embodiment, the bellows can include a sensor for determining a volume of the bellows and a management system can be configured to receive data from the sensor. In one example embodiment, the management system can be configured to receive temperature data. In one example embodiment, the management system can further be configured to determine a state of operation of vessel. In one example embodiment, the state of operation can be: 1) activation or deactivation of a heat exchanger; 2) dielectric fluid burning; and 3) dielectric fluid leaking. In one example embodiment, the management system can be further configured to determine the state of operation of the vessel using a machine learning model based on data received from the sensor and the temperature data.

In one example embodiment, the computer component can comprise a two-phase heat sink. In one example embodiment, the two-phase heat sink can include a hollow box with a liquid medium and two elongated metallic surface. In one example embodiment, the vessel can be protected by a secondary layer. In one example embodiment, the secondary layer can be parallel to an internal layer. In one example embodiment, a fluid sensor can be provided between the secondary layer and the internal layer.

In one example embodiment, a system can include a vessel configured to hold thermally conductive, condensable dielectric fluid; a computer component configured to be at least partially submerged within the dielectric fluid; a chassis configured to hold the computer component and the dielectric fluid; and a fluid circulation system configured to draw the dielectric fluid from a sump area of the vessel, pass the dielectric fluid through a filter and deliver the dielectric fluid to the chassis.

In one example, the chassis can include a fluid connector for receiving dielectric fluid from the fluid circulation system. In one example, the fluid connector can be configured to open when the chassis is placed in the vessel. In one example, the fluid connector can be configured to close when the chassis is set to be removed from the vessel.

In one example, the chassis can include a heat exchanger. In one example, the heat exchanger can be configured to receive a cooling medium from a cooling medium connector. In one example, the heat exchanger can be an electric heat exchanger. In one example, the chassis can be open such that the chassis is configured to hold a level of dielectric fluid; and a vapor of the dielectric fluid can exit the chassis into the vessel.

In one example, the system can include a fluid level sensor for determining a level of the dielectric fluid. In one example, the fluid level sensor can be located in the chassis. In one example, the system can include an inlet for receiving the dielectric fluid from a source outside of the vessel.

In one example, the system can include a valve system for connecting or disconnecting the fluid circulation system to the inlet. In one example, the fluid circulation system can include a pump. In one example, the system can include a management system configured to, when the level of the dielectric fluid falls below a threshold amount: direct the valve system to operate in a first mode of operation; and direct the pump to draw dielectric fluid from the source.

In one example, the source can include a source fluid level sensor. In one example, the management system can be configured to transmit a signal to a central server if a source fluid level drops below a threshold amount. In one example, the threshold amount is a height level for the dielectric fluid. In one example, the threshold amount is an amount of fluid needed to operate the system for a predetermined period of time determined by an artificial intelligence.

In one example embodiment, the system can comprise an inlet for receiving the dielectric fluid from a source outside of the vessel. In one example embodiment, the system can comprise a valve system for connecting or disconnecting the fluid circulation system to the inlet. In one example embodiment, the fluid circulation system can include a pump. In one example embodiment, the system can comprise a management system configured to: direct the valve system to operate in a first mode of operation in which the pump is connected to the inlet; and direct the pump to draw dielectric fluid from the source. In one example embodiment, the system can comprise a retractable hose including a sensor for detecting whether the retractable hose is connected to the source.

In one example embodiment, the management system is configured to direct the pump to draw the dielectric fluid from the source only if the retractable hose is connected to the source. In one example embodiment, the system can comprise a management system configured to: direct the valve system to operate in a second mode of operation in which the pump is connected to the sump area; and direct the pump to draw fluid from the source.

In one example embodiment, a computer component may be connected to one or more adapters which can comprise releasable rails. In one example, the computer component can slide into a rack using the rails.

In one example, a system can comprise a tank to hold a thermally conductive, condensable dielectric fluid; a pressure controller to reduce or increase an interior pressure of the tank; a computer component which can be at least partially submerged within the dielectric fluid; a condenser for condensing a gas phase of the dielectric fluid; a robot which can pick up the computer component; and a Raman spectrometer operably connected to a controller. In one example, the controller can receive a test result from the Raman spectrometer and trigger a remedial action based upon the test result.

In one example, a system can comprise a tank configured to hold thermally conductive, condensable dielectric fluid wherein said tank can be operably connected to a bellows; a rack configured to hold one or more computer components at least partially submerged within the dielectric fluid; a condenser for condensing a gas phase of the dielectric fluid; a metal retention plate configured to be attached to the bottom of the tank; and a plurality of filler plates configured to be releasably attached to the metal retention plate and configured to be below the one or more computer components in the rack.

In one example, a system can comprise a tank configured to hold thermally conductive, condensable dielectric fluid wherein said tank is operably connected to a bellows; a rack configured to hold one or more computer components at least partially submerged within the dielectric fluid; a condenser for condensing a gas phase of the dielectric fluid; a platform configured to be attached to the bottom of the tank using a shock absorber; and a vehicle configured to provide power and data connectivity to the tank.

The exemplary system can further comprise a battery for providing the power and an antenna for providing data connectivity to the tank. In the exemplary system, the shock absorber can be a spring. In the exemplary system the vehicle can include a heat vent for transferring heat from the condenser outside the tank.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Exemplary embodiments of the invention will now be described in order to illustrate various features of the invention. The embodiments described herein are not intended to be limiting as to the scope of the invention, but rather are intended to provide examples of the components, use, and operation of the invention.

Immersion Cooling System

In one example embodiment, an immersion cooling system or a vessel can include a bath area, a sump area, a computing device, a robot, a pressure control system and a management system. The vessel can be a pressure controlled tank maintained at the atmospheric pressure (or within a range thereof) which can be cooled using a heat exchanger. The computing device can be immersed in a dielectric fluid in the bath area of the vessel. The computing device can be connected to a network and perform various processing and computing tasks while immersed in the dielectric fluid. The vessel can include a lid for accessing the bath area, the computing device and the sump area. The vessel can be fluidly coupled to the pressure control system. The robot can lift the computing device from the bath area of the vessel when the lid is open. The robot can place the lifted computing device in a magazine provided for storage of computing devices or on a vehicle. The robot can also lift a computing device from the magazine (or vehicle) and place it in the place of the computing device that was lifted from the bath area. The robot can be affixed to the vessel, the vehicle or another location.

In one example, the management system can be configured with or without software and can be configured to receive any data generated by any of sensor included in the liquid immersion cooling system. In one example, the management system can make an adjustment, provide an alert, and/or take another appropriate action, e.g., based on a sensor reading. For example, the management system can adjust or control a heating element, adjust fluid flow or temperature, adjust a pressure, adjust a fluid level, fluid purity and/or any number of other system parameters. Such adjustments are often based on one or more sensed parameters of the liquid immersion cooling system.

Figure 1:
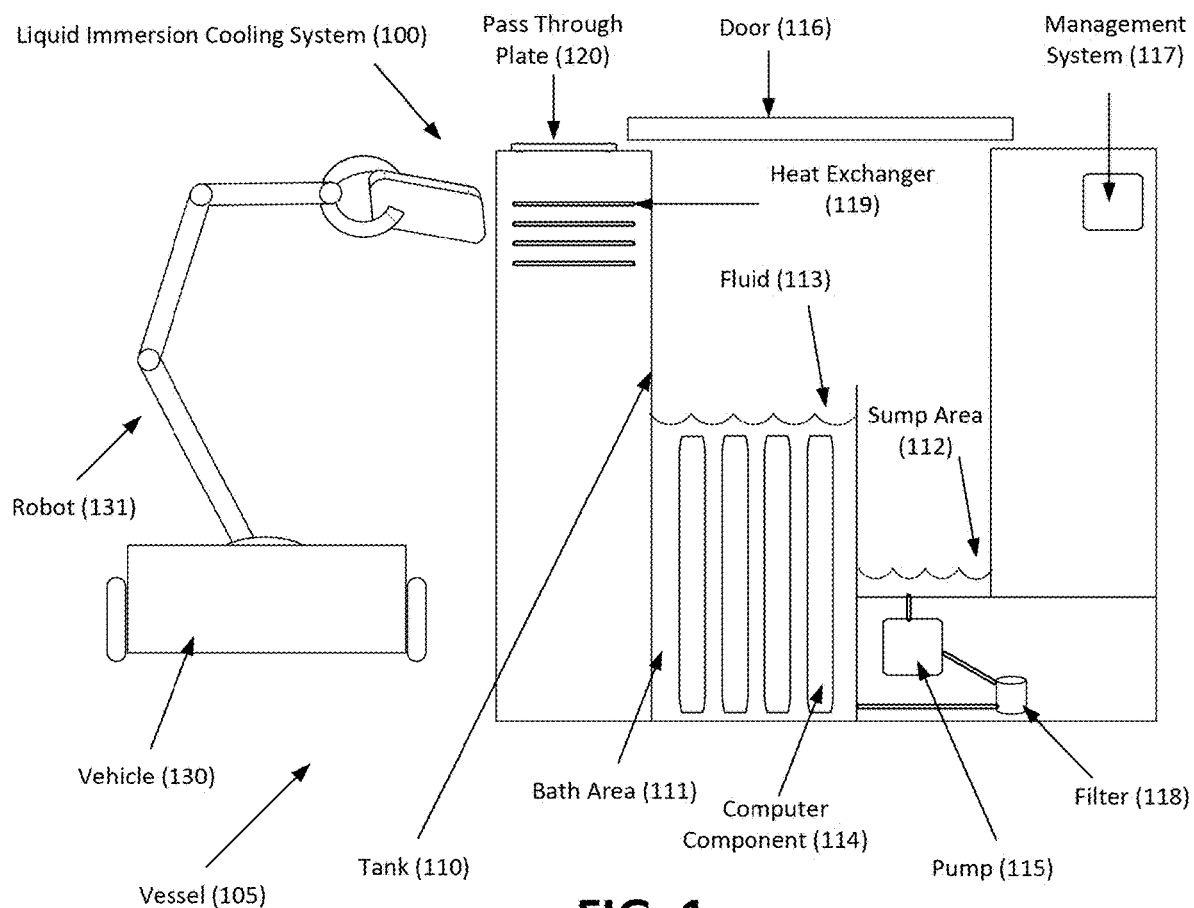
FIG. 1 shows a liquid immersion cooling system according to an example embodiment of the present disclosure.

FIG. 1 shows a liquid immersion cooling system 100 according to an example embodiment of the present disclosure. In this example embodiment, the liquid immersion cooling system 100 can include a vessel 105 and a vehicle 130. The vessel 105 can comprise a tank 110, including a bath area 111, a sump area 112, a fluid 113, a computer component 114, a pump 115, a filter 118, a door 116, a management system 117, a heat exchanger 119 and a pass through plate 120. The computer component 114 can be submersed in the fluid 113. The vehicle 130 can include a robot 131. The robot 131 can lift the computer component 114 when the door 116 is open and place the computer component 114 on the vehicle 130.

Fluid Transfer System

In one example embodiment, the vessel can include a fluid transfer system for receiving dielectric fluid from a source outside the tank and/or removing the fluid from the tank to dispose it outside the tank. Oftentimes, the dielectric fluid is shipped in large containers. Transferring the fluid from these containers to the tank of an immersion cooling system can be cumbersome and time consuming. Some use external pumps and hoses to transfer the fluid from a container to the tank. However, because these components may not be properly sealed, dielectric fluid can spill or evaporate, and thus, be wasted. Moreover, because the pumps and hoses are external to the tank system, these components can collect dust and debris, which are harmful for the dielectric fluid as well as the computing components to cooled by the dielectric fluid.

In one example embodiment, the fluid transfer system can include an inlet, a pump and various pipes that connect the inlet to the pump and the tank (e.g., bath or sump area). In this example embodiment, the inlet can be detachably connected to a container using a hose. The pump can draw the dielectric fluid from the container using the hose and through the inlet. The pump can then transfer the fluid to the tank (e.g., bath or sump area) using a pipe that connects the pump to the tank. In one example embodiment, the pump can be configured to draw fluid from the tank and transfer the fluid, through the inlet, outside the tank. In one example, the pump can be a bi-directional pump, e.g., in one mode of operation, the pump can draw fluid from the container, and in a second mode of operation, the pump can draw fluid from the tank.

In one example embodiment, the fluid transfer system can include a plurality of inlets and/or outlets, each inlet and/or outlet being coupled to a pump. For example, an inlet can be dedicated to drawing fluid from a container. In this example, the pump can draw the fluid and transfer it to the tank. As another example, an inlet (or outlet) can be dedicated to transferring fluid out of the tank using a pump. In one example, the transfer system can include a plurality of inlets, and more than one of the inlets can be connected to the pump. In this example, the pump can be fluidly coupled to more than one inlet through a valve system configured to connect one or more of the inlets to the pump. The pump can be configured to draw fluid from the container or transfer fluid out of the tank.

In one example embodiment, the fluid transfer system can include a filter. In this example embodiment, the fluid transfer system can pass the dielectric fluid through a filter before delivering the fluid to the tank. As another example, the fluid transfer system can pass the dielectric fluid through the filter when the system transfers the fluid to outside the tank.

In one example embodiment, the fluid transfer system can include several modes of operation. In a first mode of operation, the fluid transfer system can draw fluid from a container located outside the tank. The fluid transfer system can optionally pass the fluid through a filter before delivering the fluid to the tank. In this example, the filter can be located before or after the pump. In a second mode of operation, the fluid transfer system can draw fluid from the tank and transfer the fluid outside the tank. The fluid transfer system can optionally pass the fluid through a filter before delivering the fluid outside the tank. In this example, the filter can be located before or after the pump. In a third mode of operation, the fluid transfer system can circulate the fluid within the tank. For example, the pump can draw the fluid from the sump area and transfer it to the bath area. As another example, the pump can draw the fluid form the bath area and transfer it to the sump area. The fluid transfer system can optionally pass the fluid through a filter. In this example, the filter can be located before or after the pump.

In one example embodiment, the fluid transfer system can include a plurality of pumps, a valve system and one or more inlet and/or outlets. In one example, the valve system can connect any inlet and/or outlet to any pump using pipes. In one example, the valve system can connect any pump to the bath area and/or sump area. In this example embodiment, the management system can include a user interface. The user interface can be located on the vessel or it can be located remote from the vessel (e.g., connected through a network such as the Internet). A user can use the user interface to direct the fluid transfer system to start or stop any pump and direct the valve system to connect the pump to any particular area and/or inlet/outlet.

Figure 2:
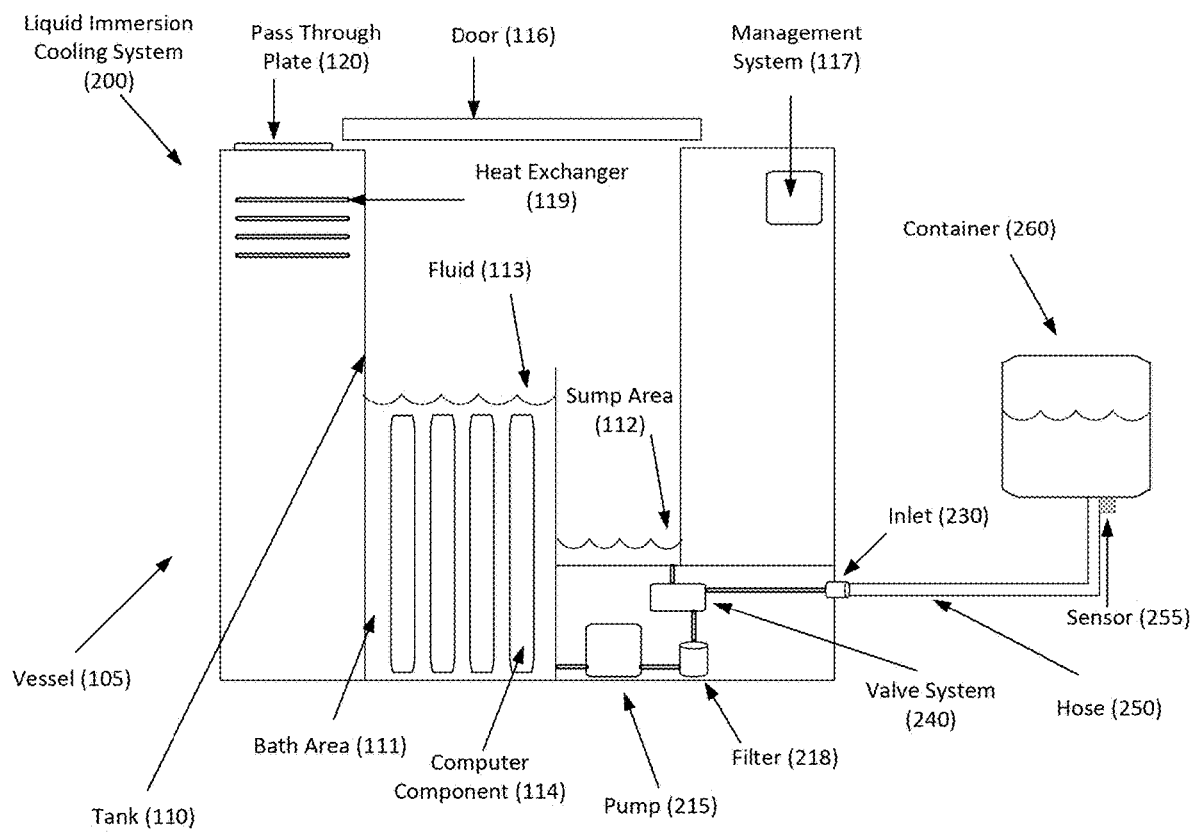
FIG. 2 shows another liquid immersion cooling system according to an example embodiment of the present disclosure.

FIG. 2 shows a liquid immersion cooling system 200 according to an example embodiment of the present disclosure. In this example embodiment, liquid immersion cooling system 200 can include an inlet 230, a valve system 240, a pump 215 and a filter 218. The pump 215 and/or the valve system 240 can be in communication with the management system 117 such that the pump 215 and/or the valve system 240 can receive signals and commands from the management system 117. The inlet 230 can be in fluid communication with the valve system 240 using a pipe. The valve system 240 can be connected to the sump area 112 and the pump 215 using pipes. The valve system 240 can be a 3-way valve which can fluidly connect the pump 215 to the inlet 230 or the sump area 112. The inlet 230 can be connected to a container 260 outside the tank 110 using, e.g., a hose 250.

In one mode of operation, the management system 117 can command the valve system 240 to connect the inlet 230 to the pump 215. In this mode of operation, the pump 215 can draw fluid from a container through the inlet 230 and transfer the fluid to the bath area 111. In another mode of operation, the management system 117 can command the valve system 240 to connect the sump area 112 to the pump 215. In this mode of operation, the pump 215 can draw fluid from the sump area 112 and transfer it to the bath area 111.

In this example embodiment, the filter 218 is located upstream the pump 215. The filter 218 can filter the incoming fluid when the pump 215 draws fluid from the inlet 230 or the sump area 112. Other arrangements are also possible. For example, the filter 218 can be bypassed in certain modes of operation, but used during other modes of operation. As another example, the filter 218 can be placed downstream the pump 215.

In one example embodiment, the hose 250 can be a retractable hose that can be stored in the vessel 105. In this example embodiment, a user can pull the hose 250 out of the vessel 105 and connect the hose 250 to the container 260 when dielectric fluid needs to be drawn from the container 260. In one example embodiment, the hose 260 can include a sensor 255 which can be activated when, e.g., the hose 250 is pulled out of the vessel 105 or the hose 250 is connected to the container 260. In this example embodiment, the sensor can be in communication with the management system 117.

In one example embedment, the management system 117 may require the hose 250 be pulled out or the hose 250 be connected to the container 260 before allowing the pump 215 to draw fluid from the container 260. In this example embodiment, if the valve system 240 is in a mode that the inlet 230 is connected to the pump 215, the management system may require the hose 250 be pulled out or the hose 250 be connected to the container 260. In one example embodiment, when the valve system 240 is in a mode that the sump area 112 is connected to the pump 215, the management system 117 may not interfere with the operation of the pump 215, i.e., the pump 215 can draw fluid from the sump area 112.

In one example embodiment, the management system 117 may command the valve system 240 to connect the pump 215 to the inlet 230 when a trigger condition is satisfied. An example trigger condition can be a change in the acidity of the dielectric fluid 113. In this example embodiment, the vessel 105 can include a sensor which can determine the acidity of the dielectric fluid 113. If a change in the acidity is detected, there is a risk that the computer component 114 may be damaged. As such, the management system 117 can immediately dispose of the fluid 113, e.g., pump the fluid 113 from the bath area 111 to outside the tank 110.

In one example embodiment, the trigger condition can be a change in the fluid level in the tank 110. In this example embodiment, the vessel 105 can include a fluid level sensor. In the event that the fluid level in the tank 110 or the bath area 111 drops below a threshold amount, the management system 117 can draw fluid. For example, the management system 117 can command the valve system 240 to connect the sump area 112 to the pump 215, e.g., if there is fluid in the sump area 112. As another example, the management system 117 can command the inlet 230 to the pump 215, e.g., if the hose 250 is connected to the container 260. The management system 117 can also command the pump 215 to draw fluid so that the level of the fluid in the tank increases.

Vibration Control System

In one example embodiment, a heat exchanger in an immersion cooling system can include a plurality of pipes which can receive cooling medium from a source outside of the vessel. The cooling medium can run through the pipes and condensate vapor in the vessel, e.g., above the bath area. In one example embodiment, the pipes can be connected to a box on each side of the pipes. Each box can be fluidly connected to the source of the cooling medium. In some modes of operation, the cooling medium can run through the pipes and the boxes at a high flow rate which can generate stress on and vibration in the boxes and/or the pipes. Oftentimes, the boxes and/or the pipes are connected to each other and other structures via welding. The stress and vibration can cause mechanical failures in the system, e.g., the welding connecting the pipes and any one of the boxes can break, and thus, the cooling medium can leak into the bath area of the vessel. When the cooling medium is mixed with the dielectric fluid, the quality of the dielectric fluid deteriorates and electrical failures can ensue.

Accordingly, in one example embodiment, a vibration damper is provided at one or more boxes or pipes to negate the harmful effects of the stress and vibration on the pipes or the boxes. In one example embodiment, the vibration damper can be a mass or weight, e.g., a metallic mass. In one example, the pipes can include a vibration sensor to measure the vibration of the pipes, and if the vibration exceeds a threshold, the vibration sensor can send a signal to the management system. Upon receiving the signal, the management system can display a warning to an operator of the liquid immersion cooling system or it can notify a central server to, e.g., indicate that the system requires service.

Figure 3:
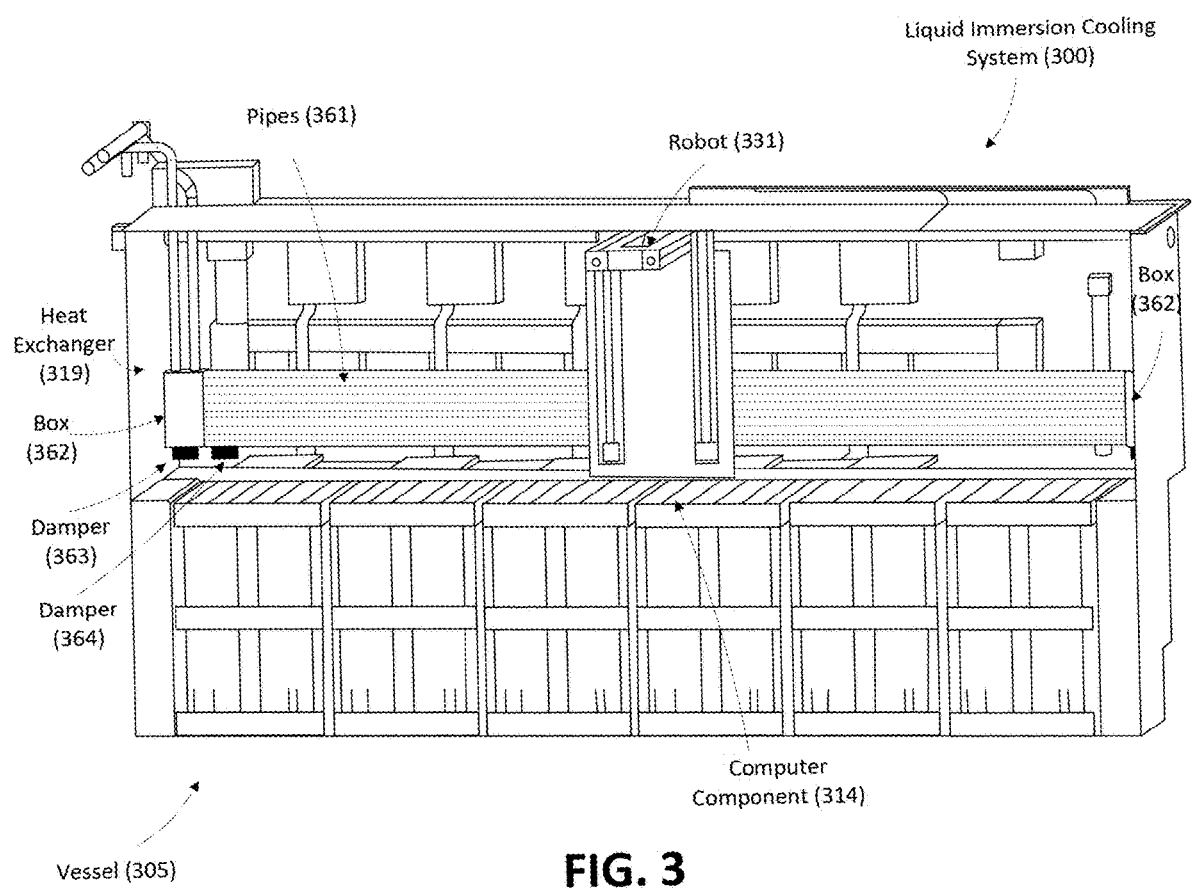
FIG. 3 shows another liquid immersion cooling system according to an example embodiment of the present disclosure.

FIG. 3 shows a liquid immersion cooling system 300 according to an example embodiment of the present disclosure. In this example embodiment, the liquid immersion cooling system 300 includes a vessel 305. The vessel 305 can include a computer component 314, a robot 331, and a heat exchanger 319. The heat exchanger 319 can include a plurality of pipes (or coils) 361, a box 362 and a damper 363. In this example embodiment, the damper 363 can be a metallic weight. The damper 363 can also be made from other matter, e.g., plastic, polycarbonate or any material compatible with the dielectric fluid. In one example embodiment, a damper 364 can be attached to a pipe. In one example embodiment, the damper can be inside or outside of the pipe or the box.

Fluid Quality Detector

In one example embodiment, an immersion cooling system can include a dielectric fluid in a bath area. The bath area can also include one or more computer components and other components such as wires, electrical circuits, connectors, etc., submerged within the bath area. These components may include dirt, debris, grease, and other contaminants which can be washed away with the dielectric fluid, and thus, contaminate the dielectric fluid. When the heat generating components (e.g., CPU, GPU, or RAM) of the computer components vaporize the contaminated fluid, these contaminants can build up as residue on these heat generating components. The residue, however, can reduce the heat transfer of the heat generating component, i.e., the rate at which the heat can be transferred from the heat generating component to the dielectric fluid can be reduced. Accordingly, the heat generating components may overheat.

Filtration can be used to manage the contamination in the tank. Filters, however, can lose their efficacy over time. Currently, there is no sensor that can accurately determine whether the filters' efficacy has been compromised and provide live data. Pressure sensors can be used to check the pressure drop within the filters but these changes are not significant enough to detect slight deterioration in filtration quality. Although analytical testing of the fluid periodically may indicate whether the fluid has become contaminated (and thus, the filter is failing to operate as intended), these tests do not provide live data.

According to an example embodiment, the temperature of the heat generating components can be used as an indicator of whether the dielectric fluid contains contaminants and whether the filter fails to clean the fluid. In one example embodiment, each computer component can determine a temperature for the component (e.g., using a thermometer, a sensor, power consumption information, or other device, technique or information). The computer component can transmit this information to the management system. The management system can receive temperature information from a plurality of computer components.

In addition, the management system can receive additional information, e.g., power consumption at the vessel, outside temperature, outside pressure, dielectric fluid temperature, temperature of incoming cooling medium, temperature of outgoing cooling medium, flow rate of the cooling medium, temperature of the area above the bath area, number of computer components present in the vessel, location of each computer component within the vessel, etc. Some or all of this information (and/or other information) can be provided to a model to make a prediction about the temperature of each (or some) of the computer components. If the temperature of the computer components exceeds the predicted temperature by more than a threshold value, the management system can indicate the computer components are overheating.

Depending on the number of computer components overheating, the management system can infer different conclusions. For example, if only one of the computer components is overheating, the management system can infer that the overhearing computer component requires manual inspection. On the other hand, if the majority (e.g., 50% or more) of the computer components are overheating, the management system can infer that the dielectric fluid has become contaminated and/or that the filter needs to be replaced. One of the ordinary skill in the art recognizes that the management system can make similar conclusions based on different numbers of computer components overheating. In one example, if the number of computer components that are overheating is below a first threshold value, the management system can indicate that the overheating computer components require manual inspection. In another example, if the number of computer components that are overheating is above a second threshold value, the management system can infer that that the quality of the dielectric fluid has deteriorated and/or that the filter needs to be replaced.

In one example embodiment, the model can be a machine learning model. The model can be trained using past data received from the vessel or other vessels. The data can include, e.g., temperature of each computing component, power consumption at the vessel, outside temperature, dielectric fluid temperature, temperature of incoming cooling medium, temperature of outgoing cooling medium, flow rate of the cooling medium, temperature of the area above the bath area, number of computer components present in the vessel, location of each computer component within the vessel, etc. This data (and/or other data) can be used to train a machine learning model to predict a temperature for the computer component.

In one example embodiment, a sensor can be used for determining whether the fluid is contaminated. For example, the sensor can include a heater, a surface and a thermometer. The heater can generate a predetermined amount of heat. In one example, the thermometer can provide data about the temperature of the surface to the model. Based on the fluctuation in the temperature of the surface for a given amount of heat, the model can predict whether the sensor is overheating and/or whether there is contaminant in the fluid.

Heat Exchanger Controller and Detection System

In one example embodiment, an immersion cooling system can include a pressure control system. The pressure control system can include a heat exchanger, a bellows, and a vapor-air separator. In one example, when the computer component generates heat, the dielectric fluid vaporizes and the pressure of the tank increases. The management system can implement one or more procedures to respond to the vaporization and the increase in pressure. For example, the management system can direct the heat exchanger to circulate the cooling medium at a faster rate so that the vapor can condense and the pressure can decrease. As another example, the management system can open a valve to the vapor-air separator so that some of the air in the tank is released, and thus, the pressure can go down again. As yet another example, the management system can open a valve so that the excess vapor can be directed to the bellows and the pressure of the tank can decrease.

In one example, the immersion cooling system can operate at atmospheric pressure. The processing demand for the computer component (and thus, the electrical power consumed by computer component) can be unpredictable. As the processing demand for the computer component fluctuates, the computer component can generate dielectric vapor or dielectric vapor can condense (i.e., become liquid). Because the tank has a fixed volume, the bellows can expand or contract in volume to maintain the internal pressure of the tank at atmospheric pressure. As such, the bellows can be prepared to both accept dielectric vapor or return the vapor to the tank. For example, when there is a spike in processing demand, the bellows can receive dielectric vapor, and when there is a drop in processing demand, the bellows can return the vapor to the tank. For optimal performance of the bellows, i.e., to effectively accept vapor from the tank and release vapor to the tank when needed, the bellows can be in a positive biased state, e.g., the bellows can be filled at about 50% during normal operation. Other biased states are also possible. For example, if more spikes in processing demand is expected than drops in the demand, the bellows can be filled at about 30%, e.g., lower than half.

In one example embodiment, the management system can utilize the ideal gas law, i.e., $PV=nRT$, to make predictions about at least one condition of the immersion cooling system and/or implement responsive procedures. For example, the immersion cooling system can include a plurality of sensors including a temperature sensor located in the tank and a sensor for determining a change in the volume of the bellows (e.g., a sensor for determining a change in the bellows height). The management system can receive data from each sensor.

In the event that the temperature sensor indicates an increase in the temperature of the tank and the volume sensor indicates an increase in the volume of the bellows, the management system can determine that vapor is being generated in the tank and that the heat exchanger can be activated (or the flow rate of the cooling medium can be increased). In this example embodiment, the bellows' volume can be controlled by modulating the amount of cooling medium circulated in the heat exchanger. For example, an increase in the flow rate of the cooling medium can condense the vapor and reduce the volume of the bellows. Similarly, in the event that the temperature sensor indicates a decrease in the temperature of the tank and the volume sensor indicates a decrease in the volume of the bellows, the management system can determine that vapor is being condensed in the tank and that the heat exchanger can be deactivated (or the flow rate of the cooling medium can be decreased). In this example embodiment, the bellows volume can be controlled by modulating the amount of cooling medium circulated in the heat exchanger. For example, a decrease in the flow rate of the cooling medium can allow for more vapor to be generated and increase the volume of the bellows.

In one example, the flow rate of the cooling medium can be modulated based on the volume of the bellows and/or the rate at which the volume of the bellows is changing. In one example, the flow rate of the cooling medium can be modulated based on the temperature of the tank and/or the rate at which the temperature of the tank is changing. The temperature of the tank can be a temperature of the dielectric fluid or a temperature of the vapor, and the temperature sensor can be located anywhere in the tank.

In one example embodiment, based on a change in the temperature of the tank (or lack thereof) and/or a change in the volume of the bellows (or lack thereof), the management system can determine leakage in the system or that the dielectric fluid is burning. In one example, when the dielectric fluid or vapor leaks from the tank, there can be a decrease in the pressure of the tank for any given state of operation of the tank (e.g., temperature, power consumption, etc.). In one example, when the dielectric fluid burns, there can be an increase in the pressure of the tank for any given state of operation of the tank.

In one example, if the temperature of the tank is not changing, but the volume of the bellows is increasing, the management system can infer that the dielectric fluid is burning. In one example, if the temperature of the tank is not changing, but the volume of the bellows is decreasing, the management system can infer that the dielectric fluid is leaking from the tank.

In one example, if the temperature of the tank is increasing, but the volume of the bellows is increasing at a faster pace than a predetermined pace, the management system can infer that the dielectric fluid is burning. In one example, if the temperature of the tank is increasing, but the volume of the bellows is increasing at a lower pace than a predetermined pace, the management system can infer that the dielectric fluid is leaking. In one example, if the temperature of the tank is increasing, and the volume of the bellows is increasing at the predetermined pace, the management system can infer that the heat exchanger needs to be activated (or the flow rate of the cooling medium has to be increased).

In one example, if the temperature of the tank is decreasing, but the volume of the bellows is decreasing at a lower pace than a predetermined pace, the management system can infer that the dielectric fluid is burning. In one example, if the temperature of the tank is decreasing, but the volume of the bellows is decreasing at a higher pace than a predetermined pace, the management system can infer that the dielectric fluid is leaking. In one example, if the temperature of the tank is decreasing, and the volume of the bellows is decreasing at the predetermined pace, the management system can infer that the heat exchanger needs to be deactivated (or the flow rate of the cooling medium has to be decreased).

In one example embodiment, the predetermined pace can be determined by a machine learning model. The machine learning model can receive data from the management system and various sensors in the immersion cooling tank in the prior cycles of operation and determine the predetermined pace based on the parameters recorded for the prior operating conditions. The predetermined pace can be a predicted rate of the change of, e.g., temperature or volume, based on the current operating conditions received by the model.

In one example embodiment, the immersion cooling system can discharge gas, e.g., using a vapor-air separator the system can collect the dielectric vapor and release the air. In one example, the immersion cooling system can implement the above described procedures while the tank does not discharge any gas. In one example, the immersion cooling system can implement the above described procedures while the tank has reached a steady state, e.g., after the tank has discharged air or after the tank has reached a steady temperature for a predetermined period of time.

In one example embodiment, the immersion cooling system can determine the volume of air that has been discharged from a tank. In this example embodiment, a volume change in the bellows can be determined after air is discharged from the immersion cooling system. The management system can use the volume change as a benchmark for determining how much air has been released from the system. In particular, the management system can receive sensor data indicating the concentration of the vapor in the tank. Using the concentration and the volume change, the management system can attribute part of the volume change to the air that has been released from the tank and another part of the volume change to the vapor.

Figure 4:
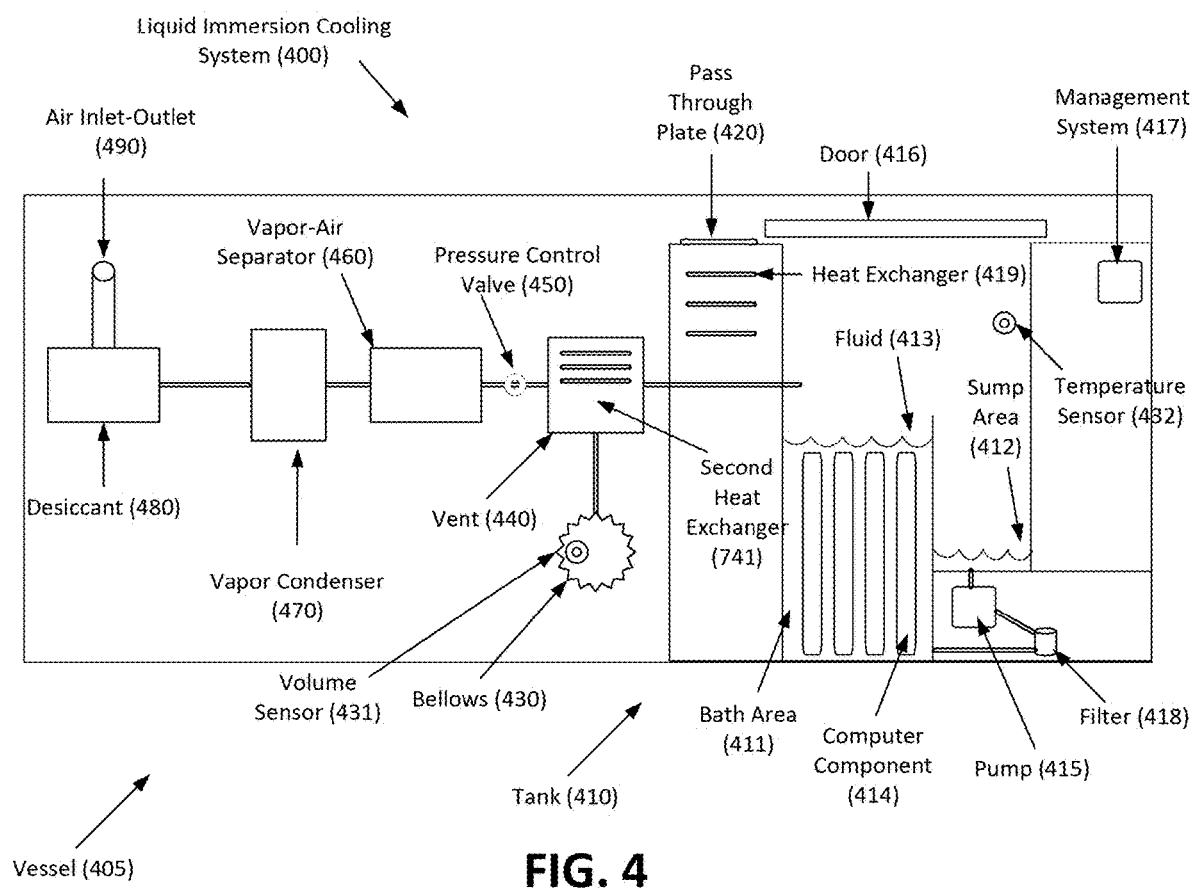
FIG. 4 shows another liquid immersion cooling system according to an example embodiment of the present disclosure.

FIG. 4 shows a liquid immersion cooling system 400 according to an example embodiment of the present disclosure. In this example embodiment, the liquid immersion cooling system 400 can include a vessel 405 which can include a tank 410. The tank 410 can include a bath area 411, a sump area 412, a fluid 413, a computer component 414, a pump 415, a filter 418, a door 416, a management system 417, a heat exchanger 419 and a pass through plate 420. The computer component 414 can be submersed in the fluid 413.

The tank 410 can be coupled to a vent 440 which can be coupled to a bellows 430 and a vapor-air separator 460 through a pressure control valve 450. In this example embodiment, the vapor-air separator 460 can be coupled to a vapor condenser 470, which can be coupled to a desiccant 480. The desiccant 480 can be coupled to an air inlet-outlet 490. As exemplary tank 410 can include one or more of the forgoing components.

In this example embodiment, the tank 410 can include a volume sensor 431 in the bellows 430 and a temperature sensor 432 in the tank 410. The volume sensor 431 and the temperature sensor 432 can provide data to the management system 417. For example, the data can include the current volume of the bellows 430 and the temperature of the tank 410. Using the data, the management system 417 can calculate a rate of change of the volume of the bellows 430 and a rate of change of the temperature of the tank 410. If the rate of change of the volume deviates from or conforms to the expected rate of change of the volume (e.g., a predetermined rate), the management system can determine, e.g., that the heat exchanger has to be activated or deactivated, that the tank is leaking or that the dielectric fluid is burning. In the event that the tank is leaking or the dielectric fluid is burning, the management system can transmit an alert signal. As one example, the alert signal can be transmitted to a user interface of the vessel 405. As another example, the alert signal can be transmitted to a remote monitoring station.

Two-Phase Heat Sink

In one example embodiment, the computer component of an immersion cooling system can be attached to a heat sink. The heat sink can facilitate transfer of heat from the computer component to the dielectric fluid in the tank of the immersion cooling system. In one example embodiment, the heat sink can be a solid copper sheet that can attach to the computer component. In one example embodiment, the heat sink can be a two-phase heat sink.

In one example, the two-phase heat sink can be a hollow box which can include a liquid medium inside. In one example, the hollow box can include two elongated sides, each of which can be made from a metal with high thermal conductivity, e.g., copper or silver. In one example, the two-phase heat sink can receive heat from the computer device on one of the elongated sides. The heat can vaporize the liquid medium inside the heat sink. The vapor can reach the other elongated side and transfer its heat. Accordingly, the vapor can cool down and/or condense. A two-phase heat sink can allow for a more effective thermal conductivity on all surfaces of the heat sink. Example liquid medium can include water, alcohol, ammonia, or even a dielectric fluid.

Figure 5:
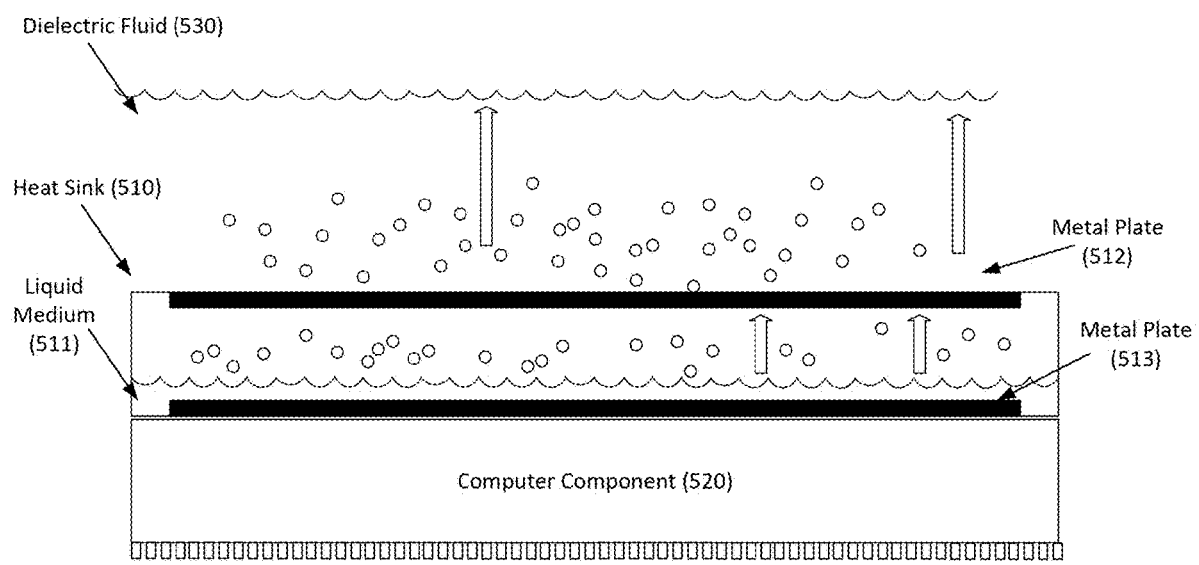
FIG. 5 shows an example two-phase heat sink according to an example embodiment.

FIG. 5 shows an example two-phase heat sink according to an example embodiment. In this example embodiment, a computer component 520 can be attached to a heat sink 510. The heat sink 510 can include metal plates 512 and 513 on the elongated sides of the heat sink 510. The heat sink 510 can also include a liquid medium 511. On one side, the heat sink 510 (through the metal plate 513) can be in thermal contact with the computer component 520 and on the other side, the heat sink 510 (through the metal plate 512) can be in thermal contact with a dielectric fluid 530 that is provided in a tank of an immersion cooling system.

The heat generated by the computer component 520 can be transferred to the metal plate 513, and then transferred to the liquid medium 511. Once the liquid medium 511 touches the other metal plate 512, the liquid medium 511 can transfer its heat to the metal plate 512. The metal plate 512 in turn can transfer its heat to the dielectric fluid 530. In one example, the heat generated by the computer component 520 may be inconsistently distributed. The heat sink 510 can receive the inconsistently distributed heat on one metal plate and effectively transfer it to the other metal plate. The uniform distribution of the heat on the other metal plate can result in a higher thermal conductivity for the heat sink.

Secondary Containment System

A concern about an immersion cooling system may be that fluids can leak from the tank due to a defect or an accident. In one example embodiment, an immersion cooling system can include a secondary layer on the vessel and/or tank. The secondary layer can provide an additional layer of protection for the vessel and/or the tank.

In one example embodiment, the secondary layer can be a wall for the vessel and/or the tank. There can be a separation between the secondary layer and the internal layer for the vessel and/or the tank. In one example embodiment, a fluid detection sensor can be provided in the separation between the secondary layer and the internal layer. The fluid detection sensor can be in communication with the management system and in the event there is a leakage of any fluid between the internal layer and the secondary layer, the management layer can transmit an alarm signal, e.g., to a user interface or a remote monitoring station. In one example, the secondary layer can be a tub or tray underneath the tank. In this example, if fluid from the tank leaks, the fluid can accumulate in the tub or tray.

Figure 6:
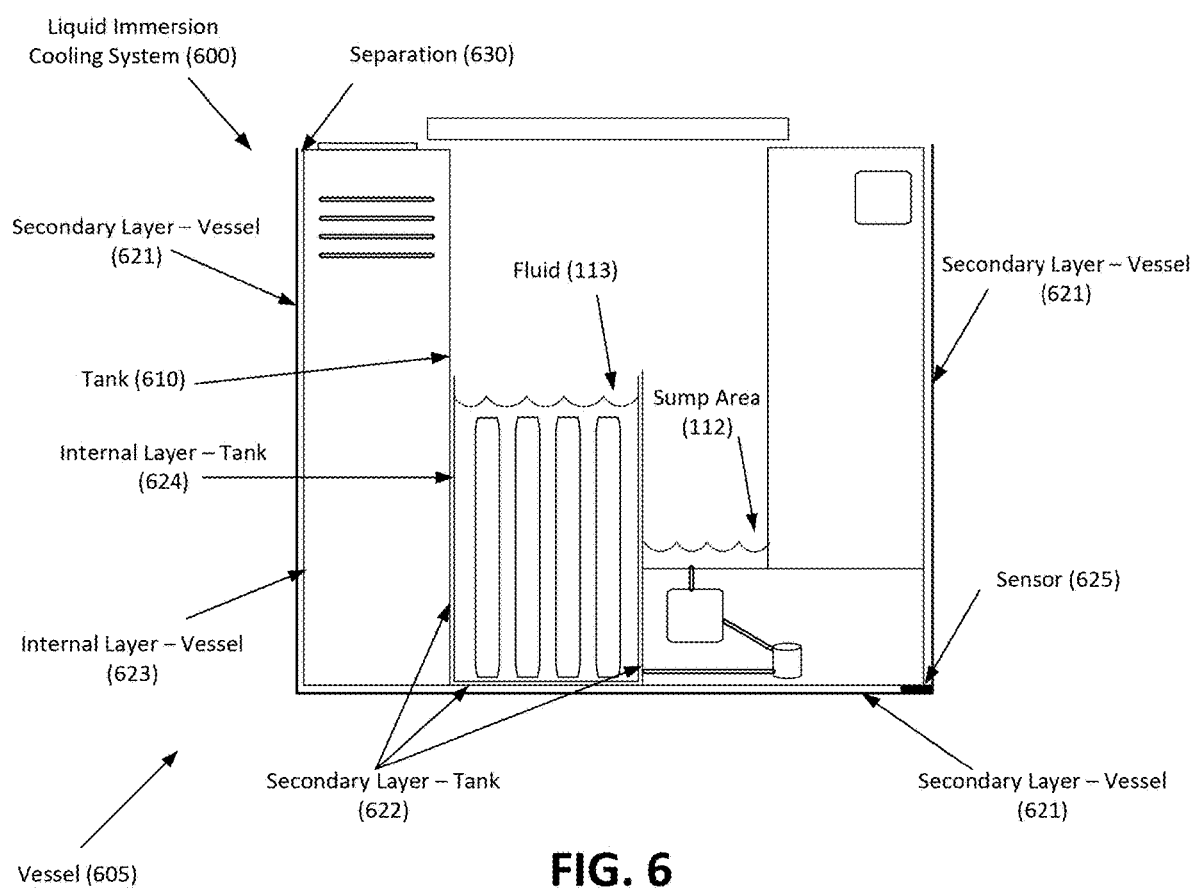
FIG. 6 shows an example liquid immersion cooling system including internal and secondary layers.

FIG. 6 shows an example liquid immersion cooling system including internal and secondary layers. In this example embodiment, the liquid immersion cooling system 600 can include a vessel 605, which can include a tank 610. The vessel 605 can include a sensor 625 for detecting leakage of fluids.

The vessel 605 can include an internal layer 623, a secondary layer 621 and a separation 630. The secondary layer can surround the vessel 605 and the internal layer 623. In one example, the secondary layer 621 can cover only one side (or a plurality of sides) of the vessel 605 and the internal layer 623. In one example, the tank 610 can include an internal layer 624, a secondary layer 622 and a separation. In this example, the secondary layer 622 can cover only one side (or a plurality of sides) of the tank 610 and the internal layer 624. In one example, a sensor can be provided in the separation between the secondary layer 622 and the internal layer 624.

In one example embodiment, each secondary layer can be parallel to an internal layer. In one example, there can be one or more columns between the internal layer and the secondary layer.

Chassis-Based Cooling System

In one example embodiment, an immersion cooling system can utilize less dielectric fluid by, e.g., providing the dielectric fluid in a chassis for each computer component. The exemplary immersion cooling system or a vessel can include a storage area, a sump area, a computer component, a robot, (optionally) a pressure control system and a management system. The vessel can (optionally) be a pressure controlled tank maintained at the atmospheric pressure (or within a range thereof) which can be cooled using a heat exchanger. The computer component can be placed in a chassis, which can receive a dielectric fluid through a fluid connector. The computer component can be connected to a network and perform various processing and computing tasks while the dielectric fluid is in the chassis. The vessel can include a lid for accessing the storage area, the computer component and the sump area. The vessel can (optionally) be fluidly coupled to the pressure control system. The robot can lift the computer component from the storage area of the vessel when the lid is open. The robot can place the lifted computer component in a magazine provided for storage of computer components or on a vehicle. The robot can also lift a computer component from the magazine (or vehicle) and place it in the place of the computer component that was lifted from the storage area. The robot can be affixed to the vessel, the vehicle or another location. In one example, the dielectric fluid can be provided in the bath area of the vessel.

Figure 7:
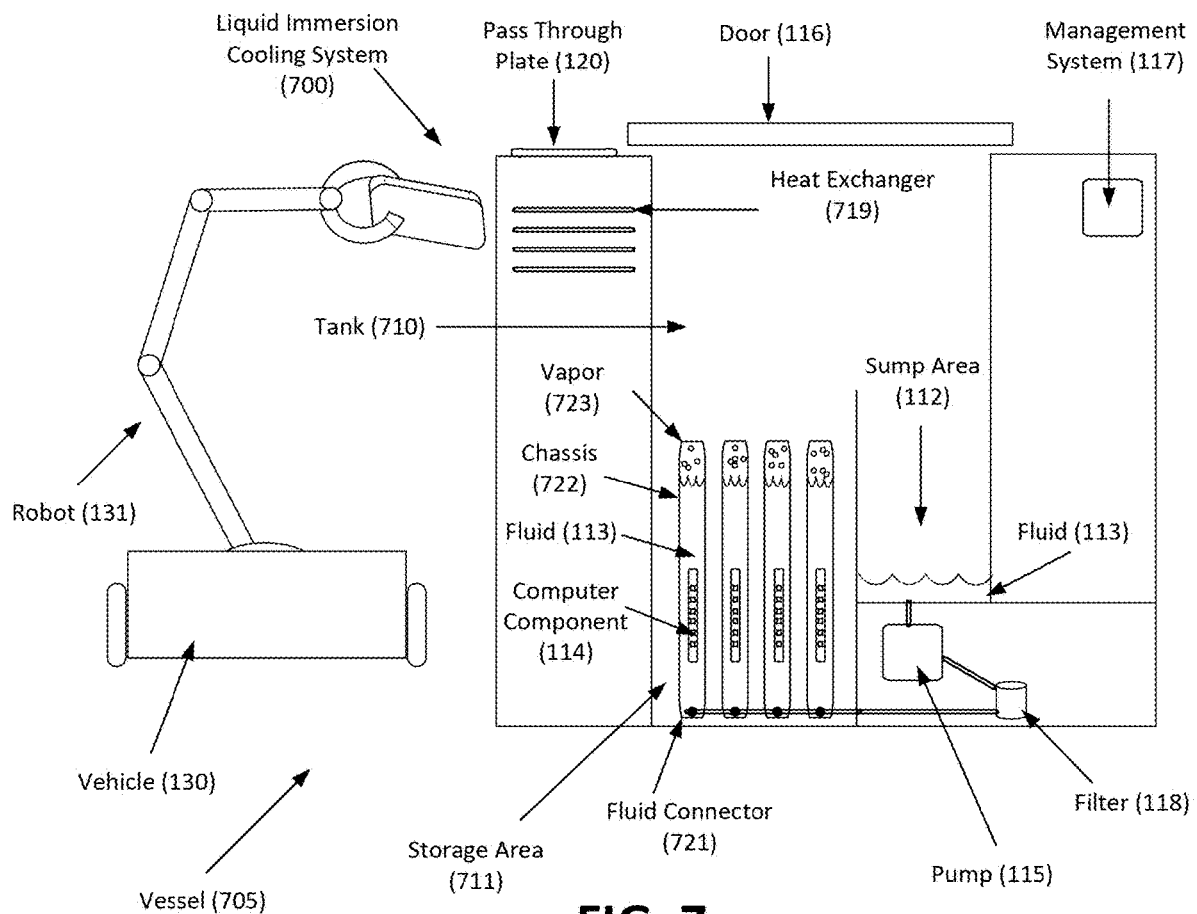
FIG. 7 shows a liquid immersion cooling system according to an example embodiment of the present disclosure.

FIG. 7 shows a liquid immersion cooling system 700 according to an example embodiment of the present disclosure. In this example embodiment, the liquid immersion cooling system 700 can include a vessel 705 and a vehicle 130. The vessel 705 can comprise a tank 710, including a storage area 711, a sump area 112, a fluid 113, a computer component 114, a pump 115, a filter 118, a door 116, a management system 117, a heat exchanger 719, a pass through plate 120, a fluid connector 721, a chassis 722 and a vapor 723. The chassis 722 can be placed in the storage area 711. The chassis 722 can receive a dielectric fluid from the fluid connector 721, and the computer component 114 can be submerged in the fluid 113 in the chassis 722. The vehicle 130 can include a robot 131. The robot 131 can lift the computer component 114 when the door 116 is open and place the computer component 114 on the vehicle 130. In one example, the sump area 112 can be sealed from the tank 710 or other areas of the vessel 105.

Chassis with Fluid Connector

In one example embodiment, a chassis 722 can include a chassis heat exchanger. In this example embodiment, the chassis 722 does not release the vapor 723, and instead, the chassis 722 cools the vapor 723 to condense. In this example embodiment, the chassis heat exchanger can be an exchanger which receives a cooling medium through, e.g., a fluid connector, and removes the heat from the chassis 722. The cooling medium can be, e.g., water. The cooling medium can be chilled in the tank, e.g., using the heat exchanger 719 or can be transferred to a cooling facility outside the tank. In this example embodiment, the chassis 722 can be a self-contained device which receives dielectric fluid and cooling medium from one or more fluid connectors 721 and cools the computer component 114. The chassis 722 can also receive power and data through various connectors.

Figure 8:
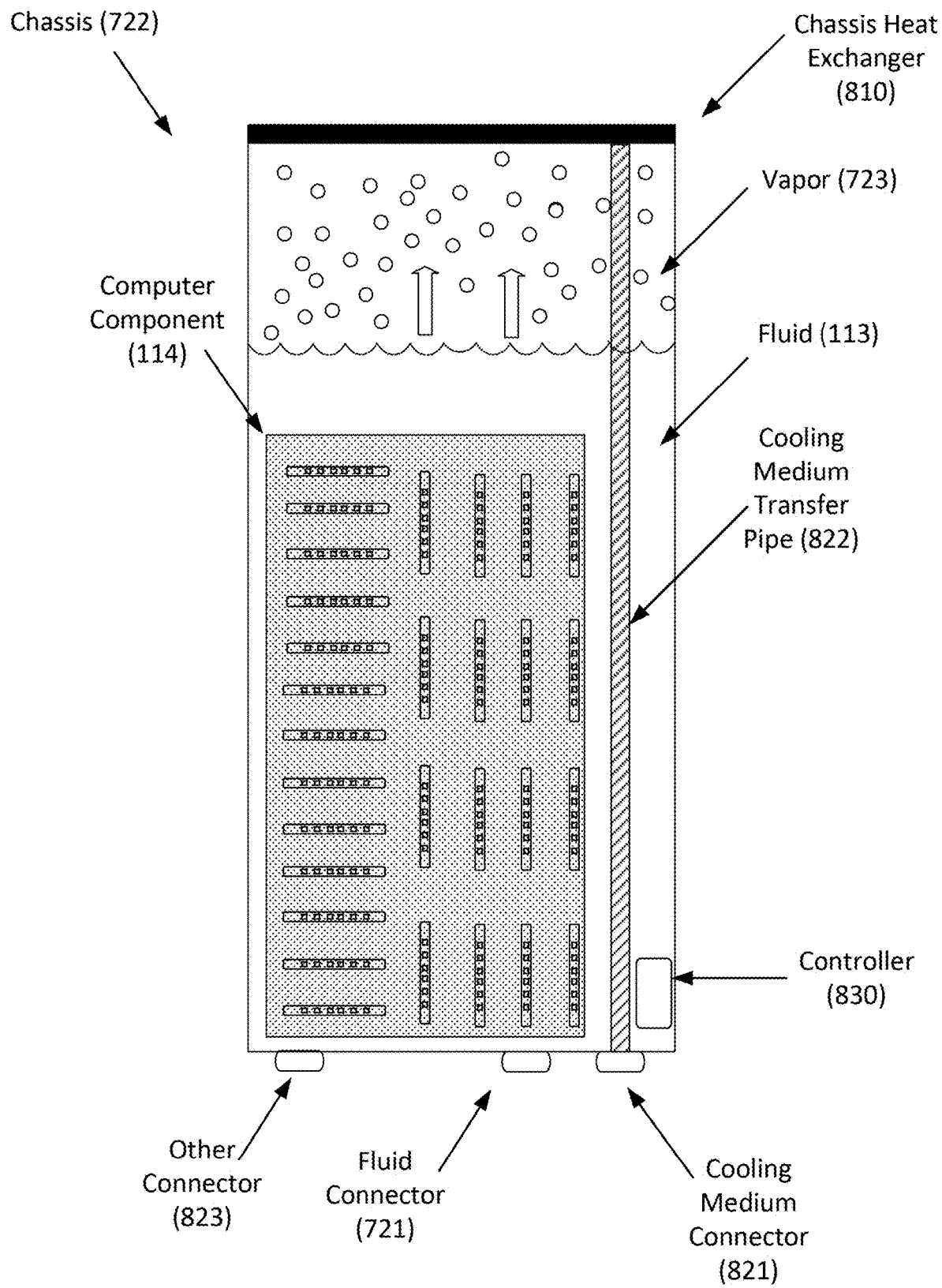
FIG. 8 shows an exemplary chassis according to an example embodiment of the present disclosure.

FIG. 8 shows an exemplary chassis 722 according to an example embodiment of the present disclosure. In this exemplary embodiment, the chassis 722 can include the computer component 114, a chassis heat exchanger 810, a cooling medium connector 821, a cooling medium transfer pipe 822, a fluid connector 721 and one or more other connectors 823. The fluid 113 (e.g., dielectric fluid) can enter the chassis 722 through the fluid connector 721. The computer component 114 can be submerged in the fluid 113 when the chassis has a sufficient amount of dielectric fluid. In one example, the cooling medium can enter the chassis 722 through the cooling medium connector 821 and be transferred to the chassis heat exchanger 810 through the cooling medium transfer pipe 822. When the computer component 114 generates heat, the fluid 113 can evaporate and rise up in the chassis 722. The vapor 723 can reach the heat exchanger 810 and lose its heat. This can result in condensing the vapor 723 and transferring heat from the vapor 723 to the cooling medium in the chassis heat exchanger 810. The cooling medium can transfer the heat away from the chassis 722. In one example embodiment, the cooling medium can be transferred to a heat exchanger 719 in the vessel 705 to cool down.

In one example, the heat exchanger can be an electric cooler, which releases the heat (removed from the chassis) in the tank 710. In this example embodiment, the electric cooler may not need a cooling medium transfer pipe. In one example, the heat exchanger can be a heat sink. For some applications, the heat sink can transfer a sufficient amount of heat away from the chassis 722. In this example embodiment, the heat from each chassis 722 can be released in the tank and the heat exchanger 719 can cool the air in the tank 710.

In one example embodiment, the dielectric fluid can transfer the heat out of the chassis 722. For example, the chassis 722 can receive an inflow of dielectric fluid through a connector. The dielectric fluid can remove heat from the computer component. Through another connector (or the same connector), the dielectric fluid can exit the chassis 722. As such, the dielectric fluid can act as a cooling medium. In this example embodiment, the chassis 722 may not need a chassis heat exchanger (though the chassis heat exchanger may optionally be provided). In this example embodiment, the tank 710 can have a heat exchanger 719 for cooling the warm dielectric fluid.

In one example embodiment, the fluid connector 721 (and/or the cooling medium connector 821) can be a valve (e.g., mechanical or electrically powered valve). For example, the fluid connector 721 can open when the chassis 722 is placed in the storage area 711. As another example, the fluid connector 721 can allow the level of the fluid to rise in the chassis 722 only up to a certain level. In this example embodiment, the chassis 722 can include a sensor for determining the level of fluid in the chassis 722. The fluid connector 721 can close once the fluid in the chassis 722 reaches a threshold height.

In one example, the chassis can include a controller 830. The controller 830 can provide a set of instructions to the fluid connector 721 and/or cooling medium connector 821. For example, the controller 830 can provide instructions when the chassis 722 is placed in the storage area 711 by the robot 131. In this example, when the chassis 722 is placed in the storage area 711, there can be no fluid 113 in the chassis 722. The controller 830 can instruct the fluid connector 721 to open up to allow fluid 113 enter the chassis 722. The controller 830 can close the fluid connector 721 when the fluid inside the chassis 722 reaches a threshold level, e.g., 95%, of the height of the chassis. The controller 830's instructions can be based on a sensor reading which determines the level of fluid in the chassis 722. In this example, the chassis 722 can optionally include a second fluid connector, which can allow for the fluid 113 to exit the chassis 722. When the chassis 722 is placed in the storage area 711 (e.g., by the robot 131), the controller 830 can instruct the second fluid connector to close, so that the fluid 113 may not exit the chassis 722 when fluid is incoming into the chassis 722 (e.g., through the fluid connector 721).

As another example, the controller 830 can provide instructions to the fluid connector 721 when the chassis 722 is set to be lifted by the robot 131. In this example, the controller 830 can instruct the fluid connector 721 (and/or the second fluid connector) to empty the chassis 722 so that there is no (or little) fluid 113 left in the chassis.

In one example, the controller 830 can provide similar instructions to the cooling medium connector 821. For example, the controller 830 can instruct the cooling medium connector 821 to open (or allow for cooling medium circulation) when the chassis 722 is placed in the storage area 711. As another example, the controller 830 can instruct the cooling medium connector 821 to close (or empty the cooling medium) when the chassis 722 is set to be lifted by the robot 131. As yet another example, the controller 830 can instruct the cooling medium connector 821 to open or close depending on a temperature of the fluid 113 in the chassis 722. If the temperature is below a threshold temperature, the controller 830 can close the cooling medium connector 821 (to prevent circulation of the cooling medium). If the temperature is above a threshold temperature, the controller 830 can open the cooling medium connector 821 (to allow for circulation of the cooling medium). In this example, the chassis 722 can include a temperature sensor.

In one example embodiment, the chassis 722 can include a connector for transferring the vapor 723 out of the chassis 722. In this example, the cooling of the vapor 723 can take place outside the chassis 722. For example, the vapor 723 can be transferred to the heat exchanger 719 for transferring the heat outside of the vessel 705. In this example, transferring the vapor 723 can take place through one or more pipes or conduits.

Figure 9:
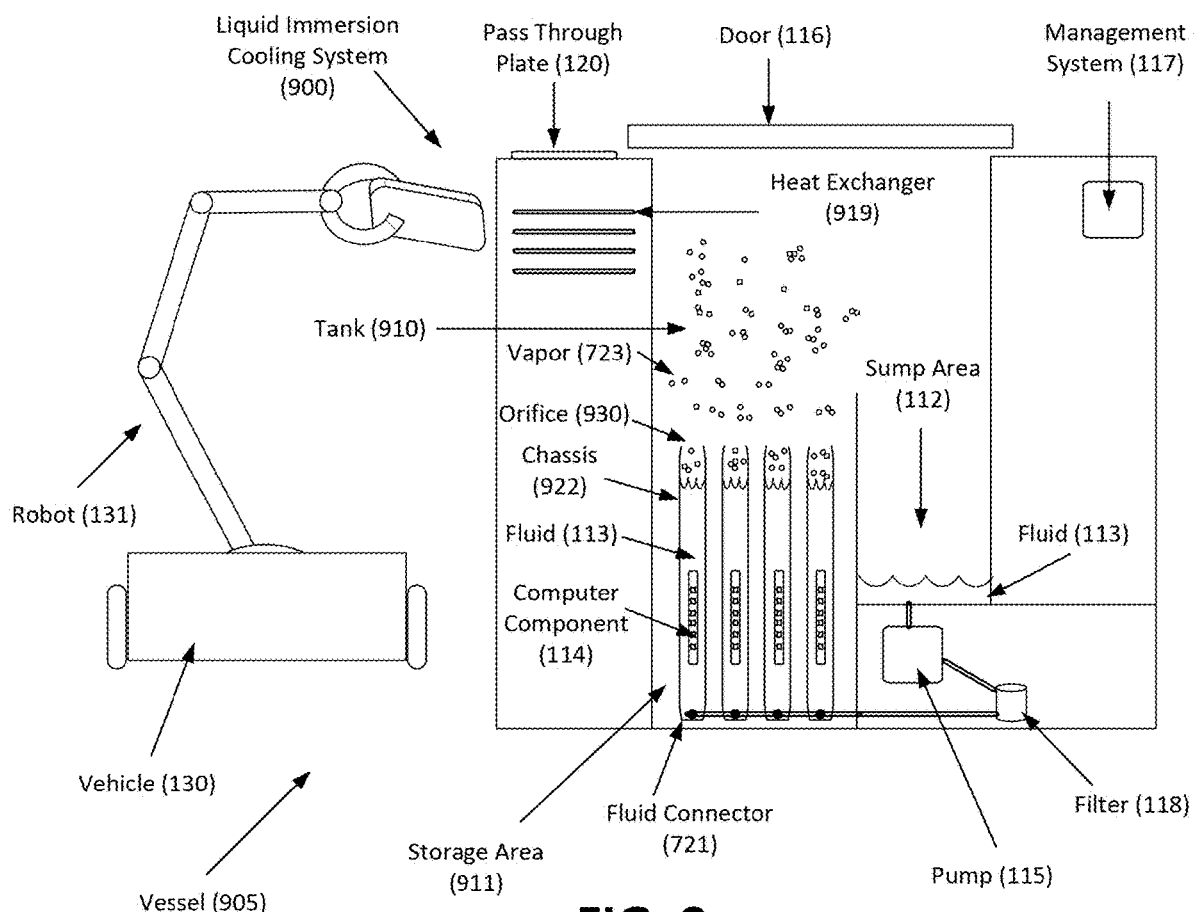
FIG. 9 shows another liquid immersion cooling system according to an example embodiment of the present disclosure.

In one example embodiment, the chassis 722 can be sealed. In this example, the chassis 722 can exchange fluids only through the connectors (e.g., fluid connector 721). In another example, the chassis 722 can have an orifice (e.g., to exchange fluids or vapor with the tank). In this example embodiment, when the computer component 114 heats up the fluid 113, the fluid 113 can vaporize and exit the chassis 722. The vapor 723 can be cooled, e.g., by the heat exchanger 119. The chassis 722 can include a fluid level sensor. As the fluid 113 vaporizes, the controller can maintain the level of the fluid 113 in the chassis 722, e.g., by adding the fluid 113 through the fluid connector 721. FIG. 9 shows a liquid immersion cooling system 900 according to an example embodiment of the present disclosure. In this example embodiment, the chassis 922 can have an orifice 930 and the vapor 723 can exit the chassis through the orifice 930. The vapor can spread in the tank 910. The heat exchanger 919 can cool the vapor and return as fluid 113, e.g., to the sump area 112 or to the storage area 911. If the fluid 113 is returned to the storage area 111, a pump can return the fluid to the sump area 112. In one example embodiment, a liquid immersion cooling system can include a number of open chassis 922 and a number of sealed chassis 722.

Chassis Arrangement Configuration

Figure 10A:
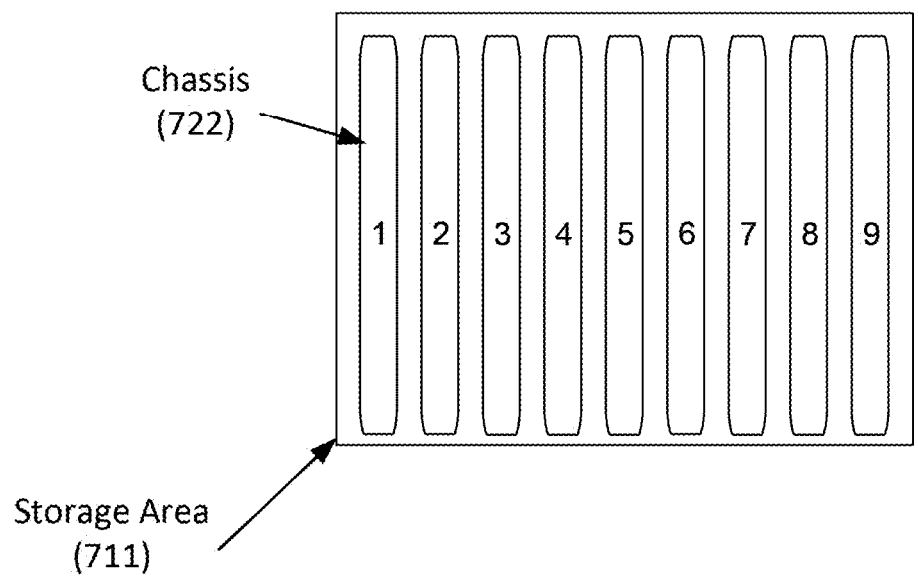
FIG. 10A shows an example top-view arrangement of chassis in a storage area according to an example embodiment.
Figure 10B:
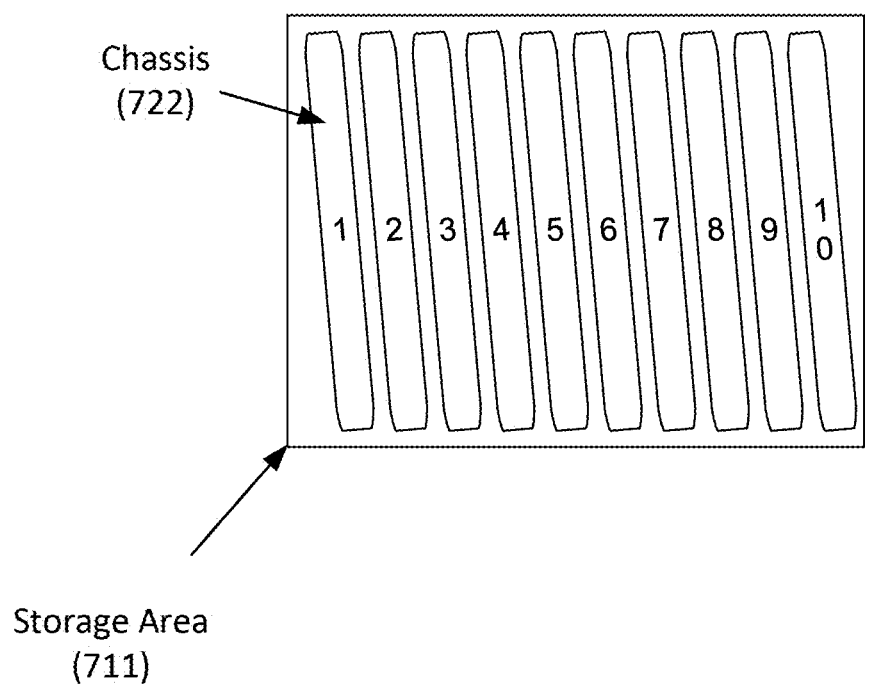
FIG. 10B shows another example top-view arrangement of chassis in a storage area according to an example embodiment.

In one example embodiment, one or more of the chassis 722 can be placed in a particular arrangement in the storage area 711 (or bath area) to conserve space. FIG. 10A shows an example top-view arrangement of chassis 722 in a storage area 711 according to an example embodiment. In this example embodiment, each of the one or more chassis 722 can be placed in a manner that is substantially parallel to the walls of the storage area 711. FIG. 10B shows another example top-view arrangement of chassis 722 in a storage area 711 according to an example embodiment. In this example embodiment, one or more chassis 722 can be place in a manner that is not substantially parallel to the walls of the storage area 711. In this example, one or more of chassis 722 can have a relative angle compared to the walls of the storage area 711. For example, one or more of chassis 722 can be titled by 5°, 10°, 15°, 20°, 25° or even a higher amount relative to the walls of the storage area 711. In this example embodiment, a higher number of the chassis 722 can be stored in the storage area 711.

Fluid Transfer System

In one example embodiment, the vessel can include a fluid transfer system for receiving dielectric fluid from a source outside the tank and/or removing the fluid from the tank to dispose it outside the tank. Oftentimes, the level of dielectric fluid can drop below a safe level, which can expose the computer components to undesired risk of overheating. In one example embodiment, the fluid transfer system can include an inlet, a pump and various pipes that connect the inlet to the pump and the tank (e.g., bath or sump area). In this example embodiment, the inlet can be connected to a container using a pipe. The pump can draw the dielectric fluid from the container using the pipe and through the inlet. The pump can then transfer the fluid to the tank (e.g., bath or sump area) using another pipe that connects the pump to the tank. In one example embodiment, the pump can be configured to draw fluid from the tank and transfer the fluid, through the inlet, outside the tank. In one example, the pump can be a bi-directional pump, e.g., in one mode of operation, the pump can draw fluid from the container, and in a second mode of operation, the pump can draw fluid from the tank.

In one example embodiment, the fluid transfer system can include several modes of operation. In a first mode of operation, the fluid transfer system can draw fluid from a container located outside the tank. The fluid transfer system can optionally pass the fluid through a filter before delivering the fluid to the tank. In this example, the filter can be located before or after the pump. In a second mode of operation, the fluid transfer system can draw fluid from the tank and transfer the fluid outside the tank. The fluid transfer system can optionally pass the fluid through a filter before delivering the fluid outside the tank. In this example, the filter can be located before or after the pump. In a third mode of operation, the fluid transfer system can circulate the fluid within the tank. For example, the pump can draw the fluid from the sump area and transfer it to the bath area. As another example, the pump can draw the fluid from the bath area and transfer it to the sump area. The fluid transfer system can optionally pass the fluid through a filter. In this example, the filter can be located before or after the pump.

Figure 11:
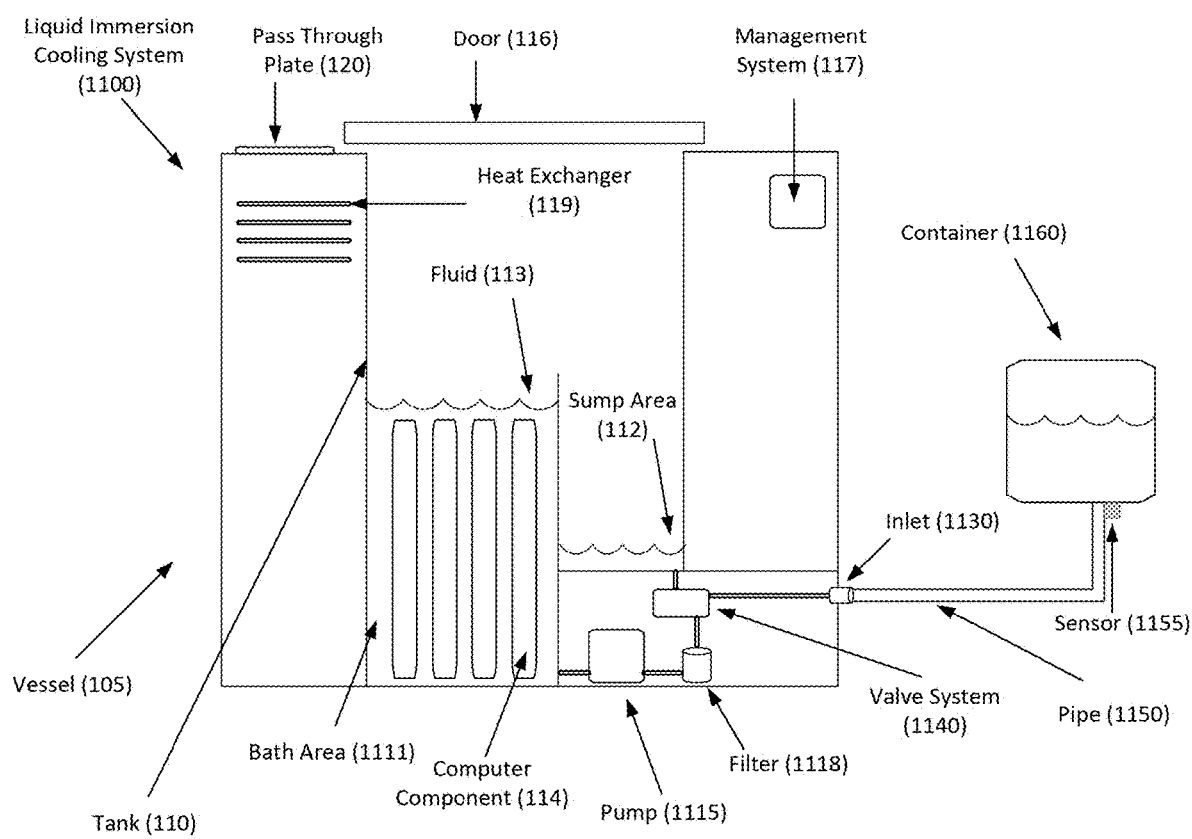
FIG. 11 shows a liquid immersion cooling system according to an example embodiment of the present disclosure.

FIG. 11 shows a liquid immersion cooling system 1100 according to an example embodiment of the present disclosure. In this example embodiment, liquid immersion cooling system 1100 can include an inlet 1130, a valve system 1140, a pump 1115 and a filter 1118. The pump 1115 and/or the valve system 1140 can be in communication with the management system 117 such that the pump 1115 and/or the valve system 1140 can receive signals and commands from the management system 117. The inlet 1130 can be in fluid communication with the valve system 1140 using a pipe. The valve system 1140 can be connected to the sump area 112 and the pump 1115 using pipes. The valve system 1140 can be a 3-way valve which can fluidly connect the pump 1115 to the inlet 1130 or the sump area 112. The inlet 1130 can be connected to a container 1160 outside the tank 110 using, e.g., a pipe 1150.

In one mode of operation, the management system 117 can command the valve system 1140 to connect the inlet 1130 to the pump 1115. In this mode of operation, the pump 1115 can draw fluid from a container through the inlet 1130 and transfer the fluid to the bath area 111. In another mode of operation, the management system 117 can command the valve system 1140 to connect the sump area 112 to the pump 1115. In this mode of operation, the pump 1115 can draw fluid from the sump area 112 and transfer it to the bath area 111.

In one example embodiment, the management system 117 may command the valve system 1140 to connect the pump 1115 to the inlet 1130 when a trigger condition is satisfied. In one example embodiment, the trigger condition can be a change in the fluid level in the tank 110. In this example embodiment, the vessel 105 can include a fluid level sensor. In the event that the fluid level in the tank 110 or the bath area 1111 drops below a threshold amount, the management system 117 can draw fluid. For example, the management system 117 can command the valve system 1140 to connect the sump area 112 to the pump 1115, e.g., if there is fluid in the sump area 112. The management system 117 can also command the pump 1115 to draw fluid so that the level of the fluid in the tank increases.

In one example embodiment, the container 1160 can include a fluid level sensor 1155. The fluid level sensor 1155 (and/or the management system 117) can determine whether there is a sufficient amount of fluid in the container 1160, e.g., if there is fluid more than a threshold amount or if there is enough fluid for use for a period of time longer than a threshold period. If the sensor 1155 determines that there is an insufficient amount of fluid in the container 1160, the sensor 1155 can send a signal to the management system 117. The management system 117 can send a signal to a central unit (or sever) to notify a user that there is an insufficient fluid in the container 1160.

In one example embodiment, the management system can determine whether there is a sufficient amount of dielectric fluid within the container using an artificial intelligence or machine learning program. For example, the artificial intelligence program can use data for the past usage of the liquid cooled immersion cooling system and determine or predict an amount of liquid needed for the system to operate for a threshold amount of time. If the level of liquid detected by the sensor is less than the predicted amount, the management system can transmit a signal to the central unit (or central server).

In one example embodiment, the management system can determine whether an accident or another event has taken place which requires emptying the fluid in the tank. For example, the management system can detect an accident if the fluid level in the tank drops below a threshold level. As another example, the management system can detect an accident if the fluid level in the tank drops faster than a threshold rate. As yet another example, the management system can detect an accident if there is fluid in the secondary layer. In the event of an accident, the management system can command the pump to draw fluid from the tank and transfer it to the container so that the fluid is not wasted. The management system can also send a signal to a central unit (or sever) to notify a user that an accident has taken place. In one example, the management system can shutdown the immersion cooling system in the event of an accident.

Heat Exchanger System

Figure 12:
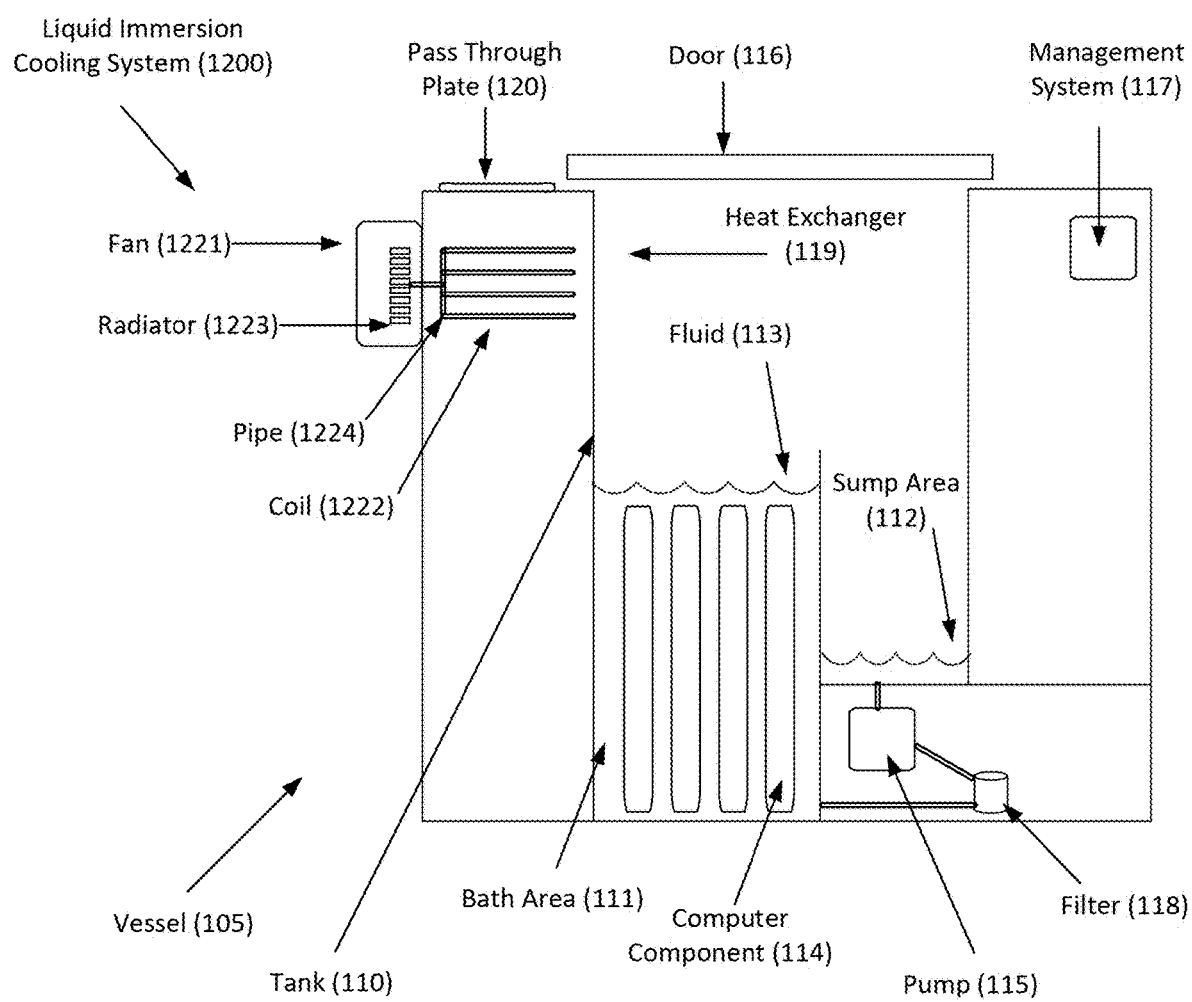
FIG. 12 shows a liquid immersion cooling system according to an example embodiment of the present disclosure.

FIG. 12 shows a liquid immersion cooling system 1200 according to an example embodiment of the present disclosure. In this example embodiment, the vessel 105 can include the heat exchanger 119 which can transfer the heat from inside the tank 110 to outside the vessel 105. The heat exchanger 119 can include, for example, one or more coils 1222, a radiator 1223 and a fan 1221. In one example, the coils 1222 can be fluidly coupled to the radiator 1223 (e.g., using one or more pipes 1224). The coils 1222 and the radiator 1223 can include a cooling medium which runs through both the coils 1222 and the radiator 1223.

In one example embodiment, the coils 1222 can be within the tank 110, but the radiator 1223 and the fan 1221 can be outside the tank. In one example embodiment, the fan 1221, the radiator 1223 and the coils 1222 are located within the vessel 105. In one example embodiment, the heat exchanger 119 can be a self-contained unit within the vessel 105. In this example embodiment, the vessel 105 does not require connection to a cooling tower or other cooling facility to maintain the temperature of the dielectric fluid within the tank 110 because the heat exchanger 119 can be a self-contained unit within the vessel 105.

In one example, the fan 1221 can force ambient air through the radiator 1223. For example, when the computer component 114 generates heat, the fluid 113 can vaporize. The vapor can exchange heat with the coils 1222 and condense. The heat exchange can transfer the heat from the vapor to the cooling medium within the coils 1222. The cooling medium can transfer to the radiator 1223, e.g., through various pipes 1224 optionally using a pump. In the radiator 1223, the cooling medium can exchange heat with the ambient air. In order to facilitate the heat exchange between the ambient air and the cooling medium within the radiator 1223, in one example, the fan 1221 can force air through the radiator 1221. In one example, the cooling medium can be water or other fluid.

In one example embodiment, the coils 1222 can be connected to a condenser-based cooling system. The cooling system can cool the working medium in the coils, and thereby, cool the tank. In one example, the management system can include a temperature predictor. The management system can adjust the operation of the cooling system based on a prediction about the temperature of the fluid in the tank or an outside temperature. In one example, the cooling system can be a dry cooling system. In one example, the cooling system can cool the tank in addition to a heat exchange that is located remote to the tank.

Heater Element

In one example embodiment, the vessel can include a heating element. The heating element can include a plurality of heating rods some of which are at least partly immersed in the dielectric fluid. The heating rods can provide heat to the vessel on demand. For example, when a computer component is removed from the tank, a heating element can replace the computer component, e.g., to generate heat as much as the computer component or to replicate the computer component's pattern of heat generation. In one example embodiment, the heating element can be placed within a chassis or a housing. The chassis or the housing can replace the chassis or housing that the computer component is placed in, e.g., the heating unit can be removed using a robot.

In one example embodiment, the heating element can operate independently of the management system 117. In this example embodiment, the heating element can include a power input, a processor and a memory. The memory can store a heat pattern and based on the heat pattern, the processor can command the heating rods to generate heat. In one example, the heating element can replicate the heating pattern of a computer component. In one example embodiment, the heating pattern can include a time function of amount of heat to be generated over a period of time, e.g., 10 watts at 1 minutes and 20 watts at 2 minutes. In one example embodiment, the heating element can include a transmitter for receiving commands from a wireless unit outside the vessel, e.g., to control the heating element or to store a heating program (or pattern).

Figure 13:
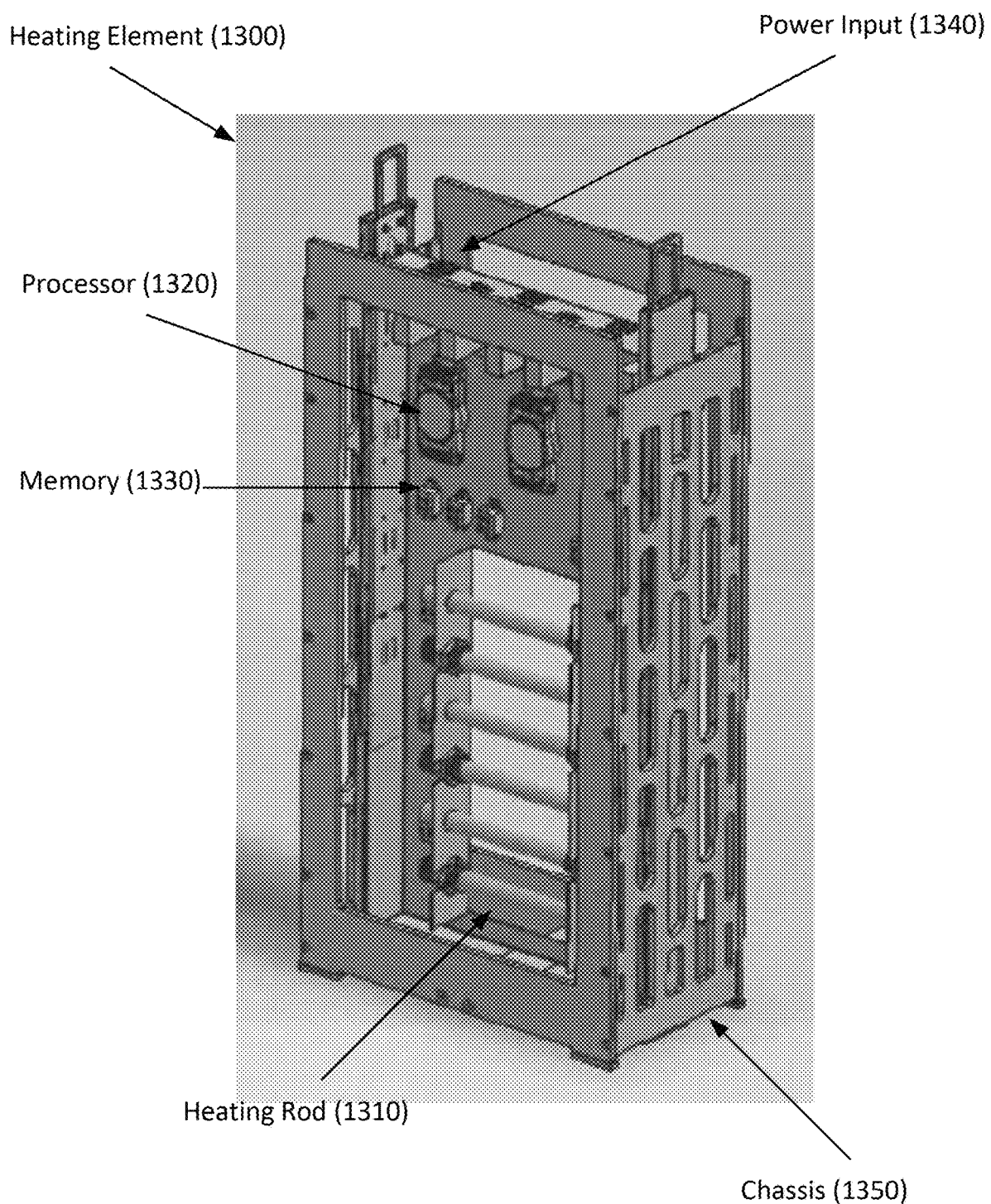
FIG. 13 shows an example embodiment of a heating element according to an example embodiment.

FIG. 13 shows an exemplary heating element 1300 according to an example embodiment. In this example embodiment, heating element 1300 can include a heating rod 1310 (which can include a copper wire), a processor 1320, a memory 1330, power input 1340 and a chassis 1350. This exemplary heating rod can replace a computer component. For example, a robot can lift the heating element and replace a computer component. In this example embodiment, the heating element can include an interface for coupling with the robot and optionally a data input interface.

Computer Adaptors

In one example embodiment, a computer component that may have been built for operation in a horizontal orientation can be used in a non-horizontal orientation such as a substantially vertical or vertical orientation by using one or more adaptors. In some embodiments, the adaptors can be applicable to computer components of all shapes and sizes. The adaptors can generally comprise releasable rails configured to be attached to a side of a computer component such that the computer component slides into a rack wherein the rack can be designed for a vertical configuration within an immersion cooling tank. In one example, using the rails, the adaptors can allow the computer component to be placed and/or removed from a rack. The adaptors can provide for coupling of almost any size computer component to the rack.

Figures 14A, 14B:
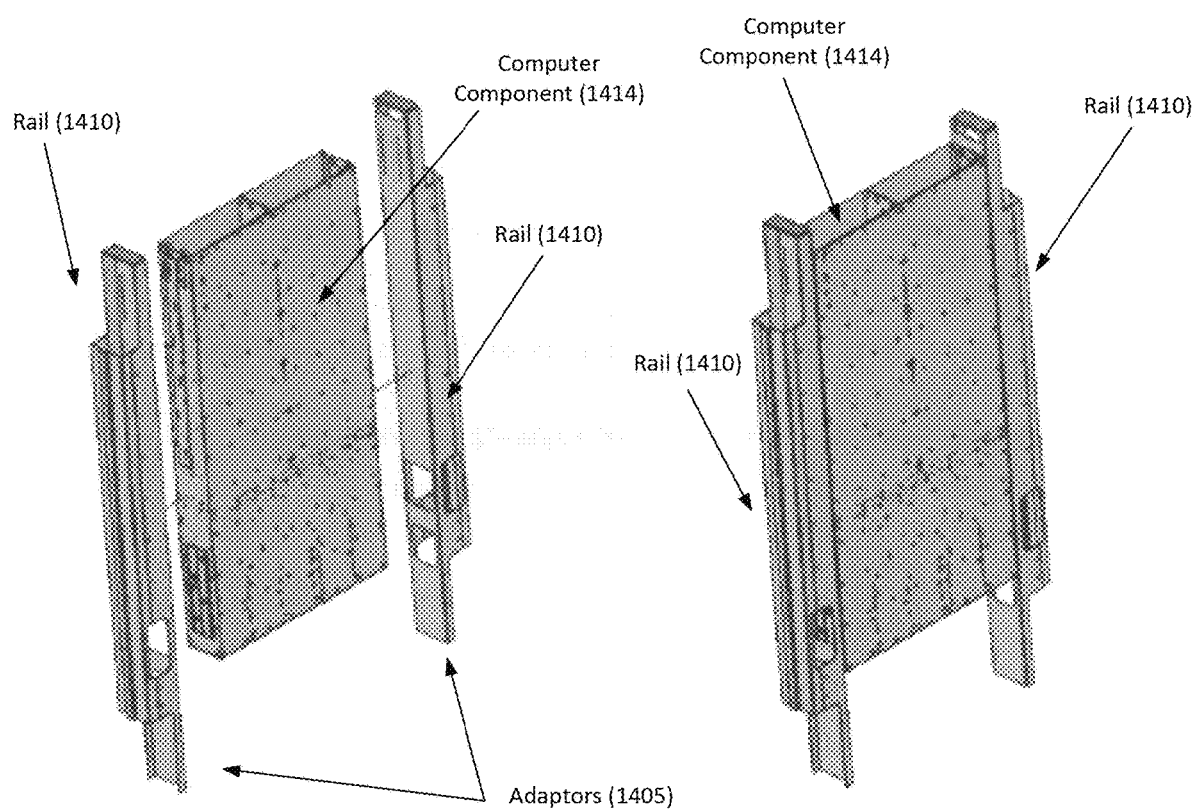
FIG. 14A shows exemplary adaptors for the opposing sides of a computer component in an unattached position.
FIG. 14B shows exemplary adaptors for the opposing sides of the computer component in an attached position.

FIG. 14A shows exemplary adaptors for the opposing sides of a computer component in an unattached position. In this example, each of the adaptors 1405 can include a rail 1410. FIG. 14B shows exemplary adaptors for the opposing sides of the computer component in an attached position.

Figure 15:
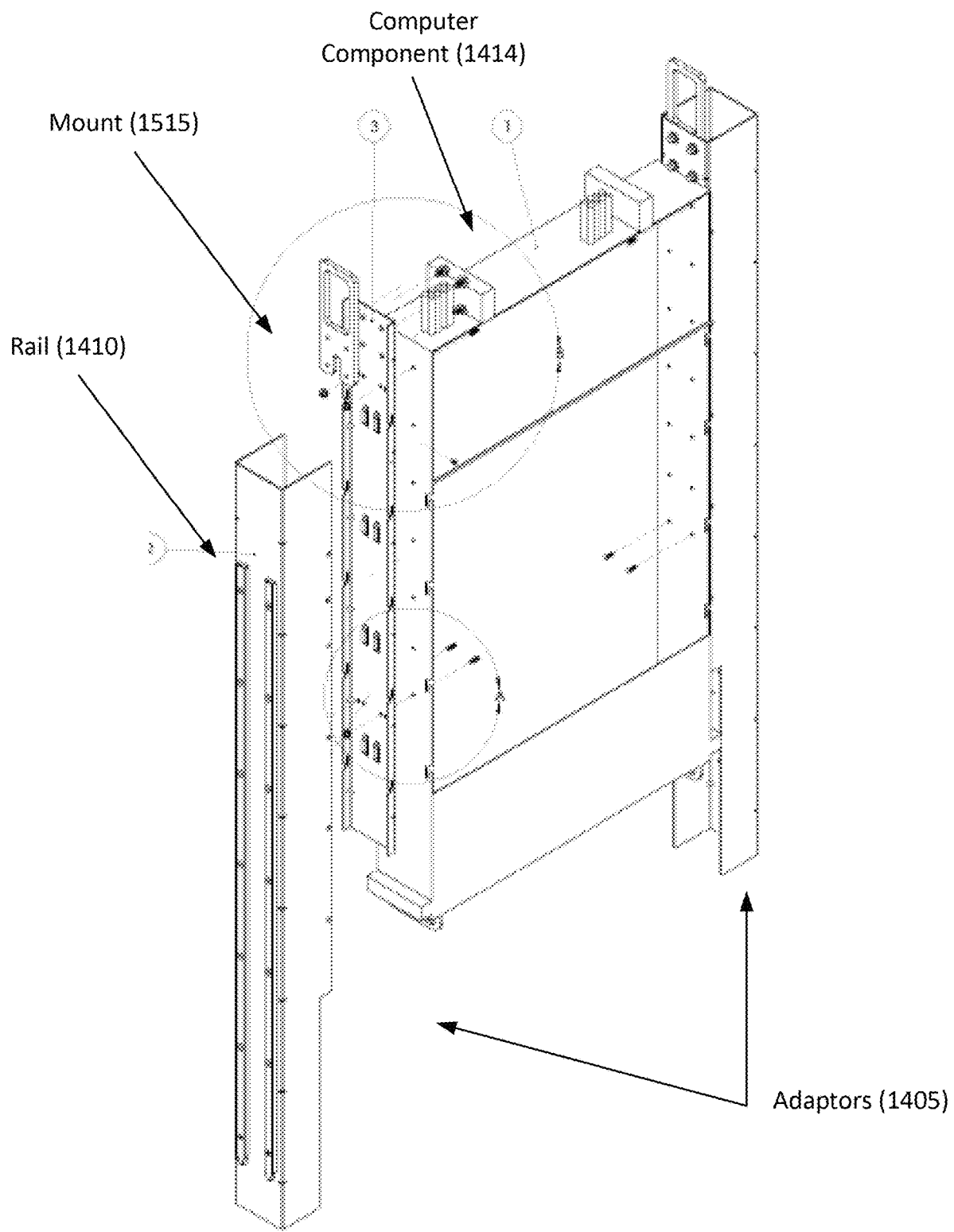
FIG. 15 shows exemplary adaptors for the opposing sides of the computer component in an attached position on the right side of the computer component and unattached position on the left side of the computer component.

FIG. 15 shows exemplary adaptors for the opposing sides of the computer component in an attached position on the right side of the computer component and unattached position on the left side of the computer component. In this example, the adaptor 1405 can include a rail 1410 and a mount 1515. The mount 1515 can connect the computer component 1414 to the rail 1410.

Figure 16:
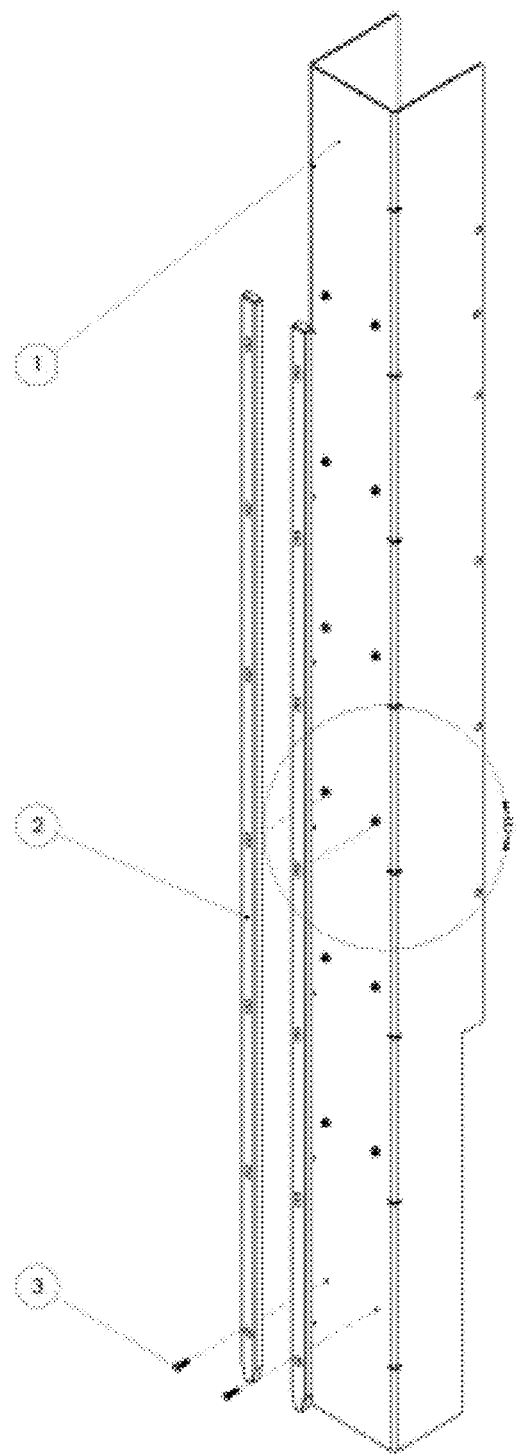
FIG. 16 shows a rail assembly for an exemplary adaptor of the present application.

FIG. 16 shows a rail assembly for an exemplary adaptor of the present application.

Figure 17:
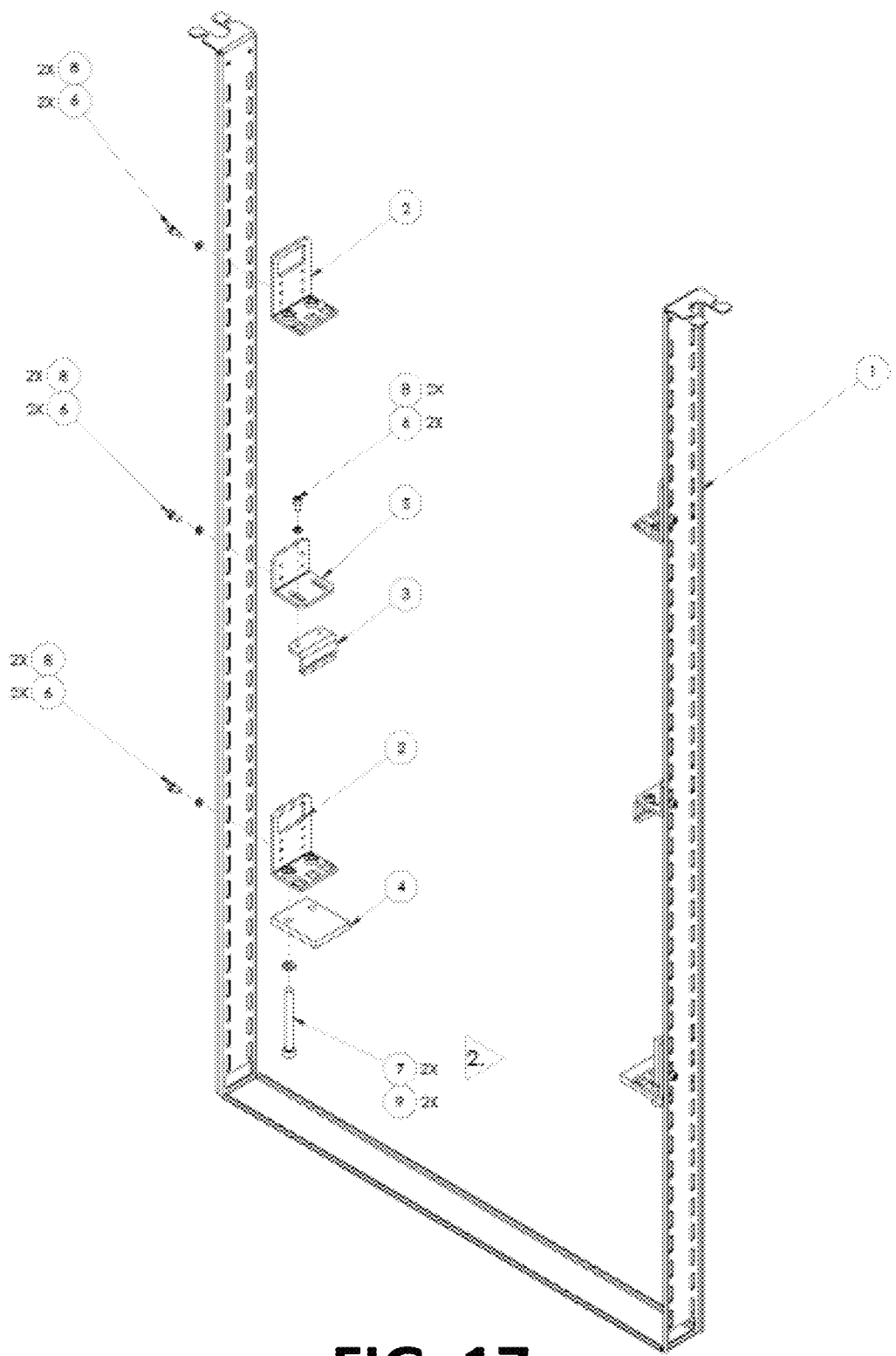
FIG. 17 shows an exemplary carrier bracket assembly.

FIG. 17 shows an exemplary carrier bracket assembly. In this example, the carrier bracket assembly can be provided in the rack. The rails 1410 can couple to the carrier bracket assembly and enable slidable movement of the rails 1410 relative to the carrier bracket assembly as well as the rack.

Figure 18:
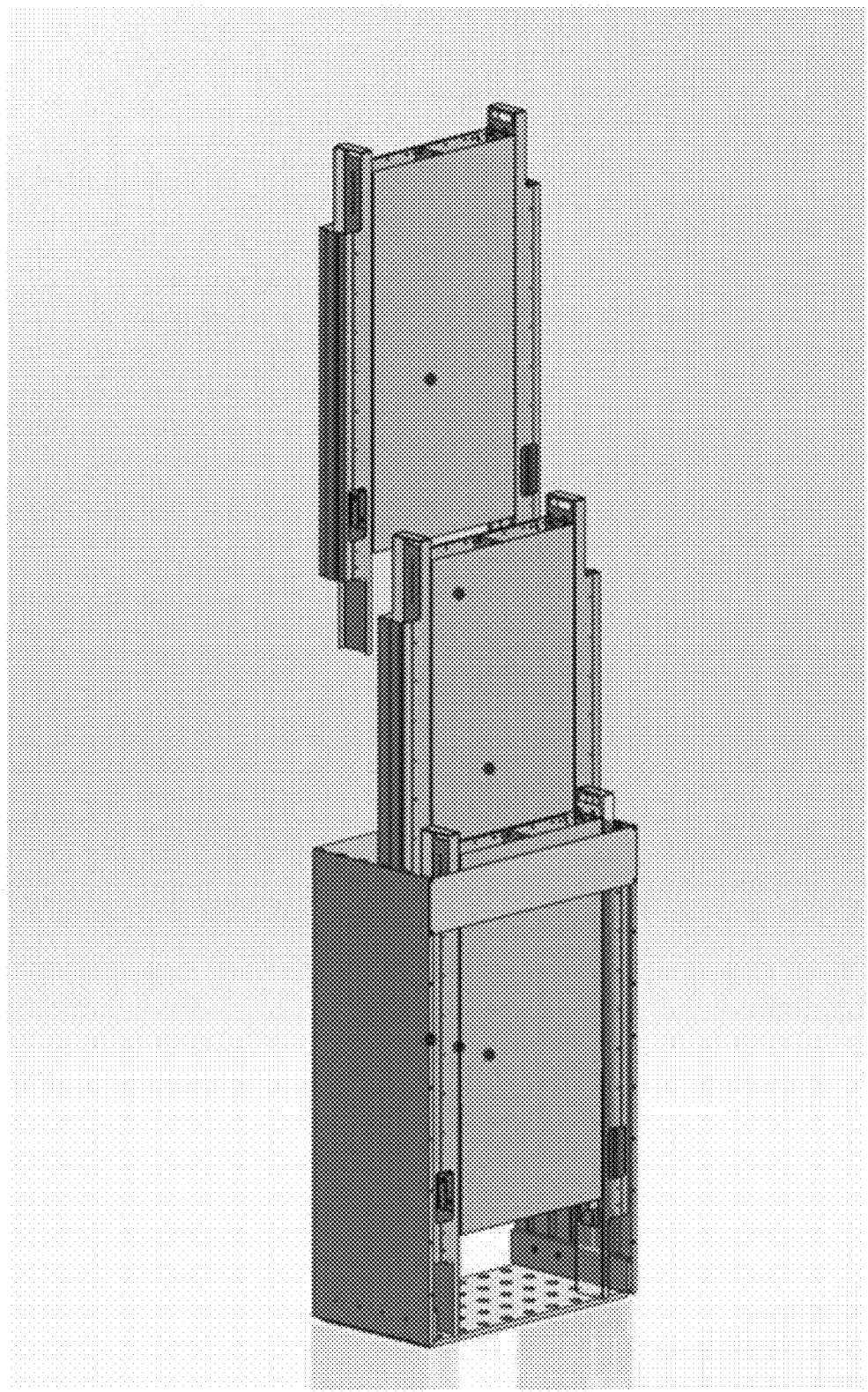
FIG. 18 shows exemplary computer components with the adaptors described herein being slid into an immersion cooling rack.

FIG. 18 shows exemplary computer components with the adaptors described herein being slid into an immersion cooling rack. In this example, the rails of each computer component are coupled to the carrier bracket assembly and enable the sliding of the computer component into the rack.

Dielectric Fluid Monitoring

Halocarbons such as perflouorocarbon liquid dielectic fluids such as NOVEC™ are frequently employed in immersion cooling of computer components such as servers. Unfortunately, at the conditions employed, the halocarbons may degrade into other substances such as acids, bases, and the like. These changes and degradations, which may be harmful to the computer components and/or other aspects of the liquid immersion cooling system, are difficult to detect in the fluid. Therefore, it is desirable to determine whether the composition of the fluid in the liquid immersion cooling system has changed. In example embodiment, a Raman spectrometer can be implemented in the liquid immersion cooling system to detect the composition and/or changes in the composition of the dielectric fluid.

Figure 19:
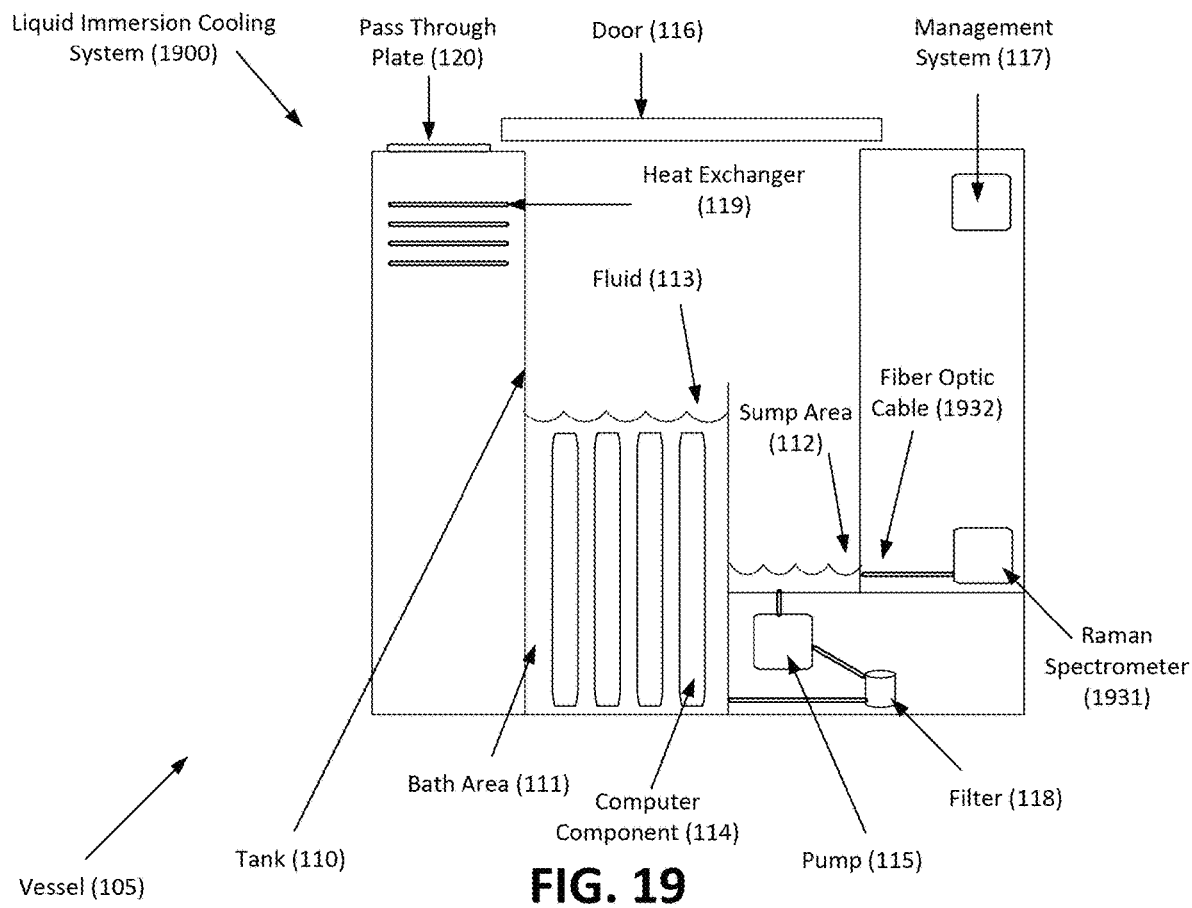
FIG. 19 shows an exemplary immersion cooling system including a Raman spectrometer.

FIG. 19 shows an exemplary immersion cooling system 1900 including a Raman spectrometer 1931. In this example embodiment, the Raman spectrometer 1931 can be operably connected to the tank area 110 or the sump area 112 of the liquid immersion cooling system 1900. The Raman spectrometer 1931 can excite the fluid 113 to an upper excited state and upon relaxation show an emission at frequencies corresponding to chemical bonds so the fluid can be tested for impurities. In one example, a fiber optic cable 1932 can connect the Raman spectrometer 1931 to the tank area 110 or the sump area 112. Other connections may also be employed to excite the molecules and analyze the results. In one example, one connection can be employed to excite the molecules and a separate connection can be employed to analyze any results. In addition, the location of the spectrometer is not particularly critical and may be located in the liquid immersion cooling system 1900, on the liquid immersion cooling system 1900, or anywhere it is convenient. In one example, use of the Raman spectrometer or another spectrometer or analytical method facilitates understanding any contaminant components in the fluid 113 along with their relative concentration. In this manner, remedial action may be instituted manually or automatically as described below via the controller or in another manner.

In some embodiments, the Raman spectrometer can be operably connected to the management system 117 (or a controller). The management system 117 can receive a test result from the Raman spectrometer 1931 and trigger a remedial action based upon the test result. Of course, the test result may also indicate that no remedial action need be taken and the controller can recognize and/or implement that as well.

Fluid Reduction Spacers

Two-phase immersion cooling can employ dielectric fluid which is expensive. In addition, the dielectric fluid vapor may occupy a bellows to allow for pressure regulation within an immersion cooling tank. The bellows may be very large and therefor require a large footprint for the system. Therefore, it may be desirable to reduce the amount of fluid employed in a liquid immersion cooling system. Additionally, it can be beneficial if the vapor burden of the system is lowered such that the size of the bellows could be reduced. It would further be desirable if such solutions were not particularly costly, were relatively easy to implement, and did not affect performance of the fluid.

In one example embodiment, the liquid immersion cooling system can comprise a metal retention plate configured to be attached to the bottom of the immersion cooling tank. A plurality of filler plates can be releasably attached to the metal retention plate and configured to be below one or more computer components within the tank.

In another embodiment the application pertains to methods which involve at least partially submerging a computer component in a thermally conductive, condensable dielectric fluid. The computer component may be mounted in a chassis comprising a backplane for receiving power from a rack. The computer component can dissipate heat in the dielectric fluid when the computer component operates. A condenser can be employed to condense a gas phase of the dielectric fluid to a liquid phase of the dielectric fluid. The rack is within a tank operably connected to a bellows. A metal retention plate is configured to be attached to the bottom of the tank. A plurality of filler plates are configured to be releasably attached to the metal retention plate and configured to be below the one or more computer components in the rack. The filler plates act to reduce the amount of fluid that is necessary and also may reduce the bellows size requirements.

In one example, a metal retention plate configured to be attached to the bottom of the immersion cooling tank and a plurality of filler plates configured to be releasably attached to the metal retention plate and configured to be below one or more computer components within the tank. In this manner the filler plates reduce the amount of immersion fluid required.

The filler plates can be made of any material that does not interfere with the operation of the disclosed immersion cooling system. For example, the plates may be made of materials including, but not limited to, metals, rubbers, silicone, and/or polymers. Preferred materials are not substantially soluble in the dielectric fluid. In some embodiments the one or more up to all of the filler plates comprise a material of lower density than the dielectric fluid. Such materials include a thermoplastic such as, for example, a polyoxymethylene like DELRIN® available from DuPont.

In some embodiments, the filler plates may be configured to selectively attach and release from the metal retention plate without the use of tools. The selective attachment mechanism is not particularly critical so long as it prevents displacement during operation. For example, interlocking sections may be made with recessed portions and/or a rail and slide mechanism could be employed.

If desired other filler plates may also be employed besides those below the computer components. For example, a second filler plate configured to be releasably attached to the metal retention plate and/or be configured to be laterally adjacent to one or more computer components within the tank. For example, a second filler plate could be laterally adjacent on both sides of a group of vertically placed servers to occupy space between the servers and the side walls of the tank. Of course, filler plates could also be in the front or the back of the servers as needed. In such cases the second filler plates could additionally or alternatively be attached to a side wall of the tank and/or to the metal retention plate.

Figure 20:
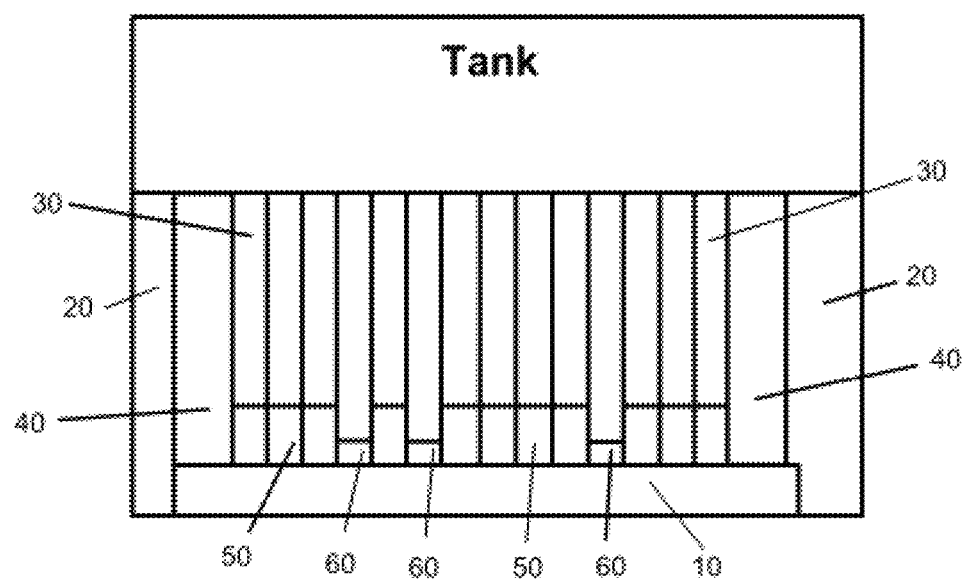
FIG. 20 shows an exemplary bottom retention plate attached to the bottom or floor of the immersion cooling fluid tank.

A representative system is shown in FIG. 20 although many different variations can be employed. As shown in FIG. 20 a bottom retention plate 10 can be attached to the bottom or floor of the immersion cooling fluid tank. The dielectric fluid 20 can surround the computer components, e.g., servers 30, to cool them while in use. As shown in FIG. 20, there can be 14 servers in a vertical, side by side configuration although any number of servers could be employed in any configuration. Also, as shown in FIG. 20, the servers 30 can vary in size. Thus, longer filler plates 50 can be interspersed with shorter filler plates 60 with either type typically attached to bottom retention plate 10. If desired, a side filler plate 40 may be used on either lateral side and/or in the front or back side of the tank. In such cases, the filler plate 40 may be attached to the bottom retention plate 10 and/or the tank wall adjacent to the filler plate 40. Advantageously, the selective attachment and removal mechanisms are configured so that the filler plates are readily attached and removed without the use of tools as the server configuration is changed within the tank. The use of the systems and methods described herein may reduce fluid use and/or allow for reducing the size of the bellows.

Mobile Immersion Cooling System

In one example embodiment, an immersion cooling system can be mounted a mobile body. the mobile body can be a vehicle, a car, a boat, an air plane, a train, a container or any other transportable body. In this example embodiment, the principal of operation of the immersion cooling system can be the same or similar to the other immersion cooling systems of the present disclosure. In other example embodiments, the principal of operation of the immersion cooling system may be different than the immersion cooling systems disclosed herein.

In one example, the immersion cooling system can include a tank, a cooling system, a plurality of computer components, and a dielectric medium. In one example, the immersion cooling system can receive power from the vehicle. In other examples, the power may be derived from, for example, a generator (e.g., gasoline), batteries, solar panels, wind turbines, wave power generators, or any combination thereof.

In one example, a wall between the bath area and the sump area can be taller for the immersion cooling systems mounted on a vehicle. In this example, the taller wall ensures that more fluid remains in the bath area even when the fluid in the immersion cooling system experiences turbulence or stress. In one example, the bath area is connected to the sump area only through a small hole on the wall in between the bath area and the sump area. In one example, a pump can draw the fluid from the bath area and transfer it to the sump area. In these examples, the turbulence caused by the movement of the vehicle may not result in the bath area having an inadequate level of fluid.

In one example, the immersion cooling system can be wireless. For example, the immersion cooling system can send and/or receive data signals wirelessly. In this example, the immersion cooling system can have wireless connectivity using Wi-Fi, satellite, cellular, other wireless connections or any combination thereof. In one example embodiment, the immersion cooling system or the vehicle can include an antenna for transmission or receiving data signals. In one example, the immersion cooling system or the vehicle can include other equipment required for conducting wireless data communication. In one example, the immersion cooling system or the vehicle can include an interface for receiving data signals. The interface can provide for, e.g., Ethernet connectivity or other types of connectivity.

In one example, when the vehicle moves, the immersion cooling system and its components can receive shocks and vibrate. To minimize such stress on the immersion cooling system, the immersion cooling system can be mounted on a platform via a damping implement. The damping implement can be a spring or other similar devices which can absorb some or all of the stress transferred from the vehicle to the immersion cooling system and/or its components. The platform and the damping implement can couple the immersion cooling system to the vehicle, box or the container in which the immersion cooling system is located.

Figure 21:
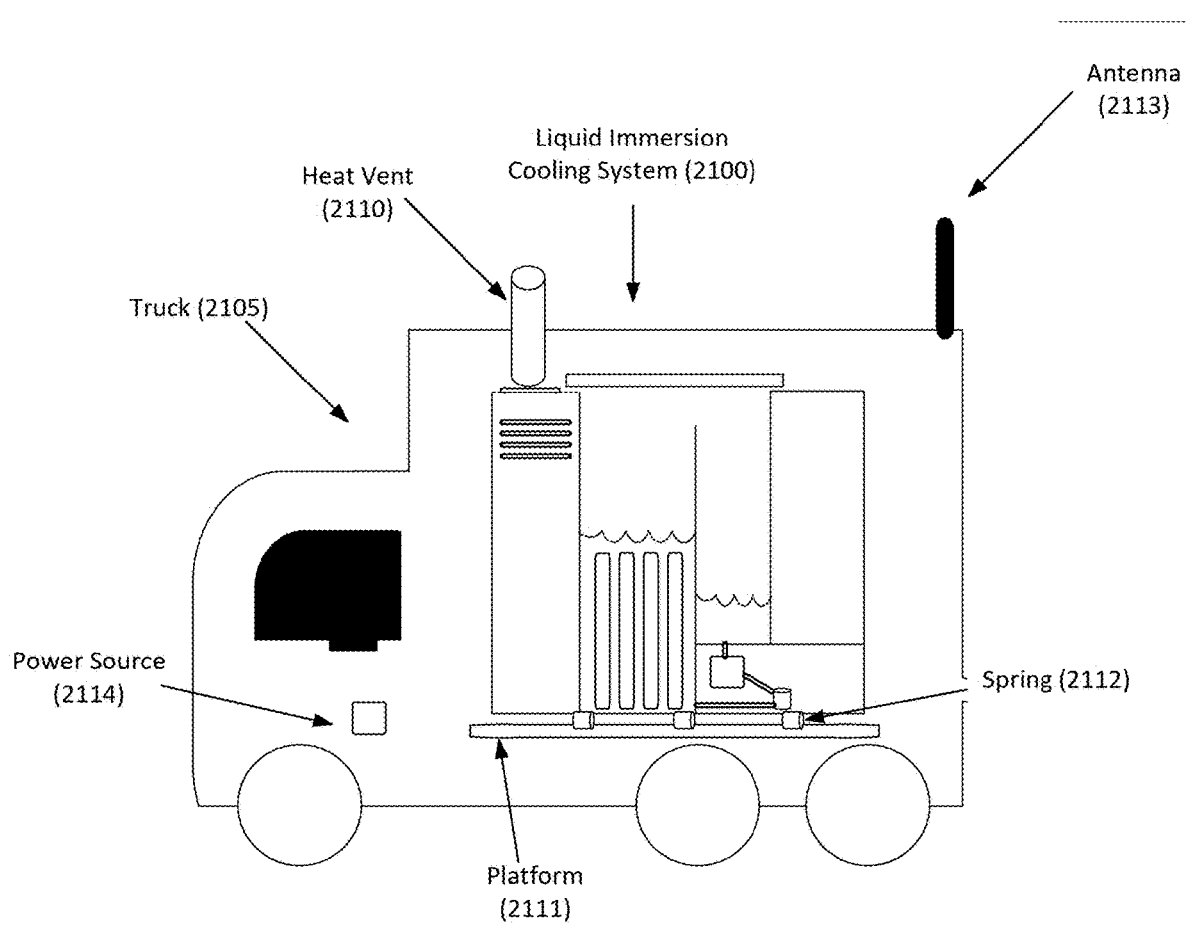
FIG. 21 shows an example immersion cooling system mounted on a truck.

FIG. 21 shows an example immersion cooling system 2100 mounted on a truck 2105. In this example, the truck 2105 can include a power source 2114 for providing power to the immersion cooling system 2100. The truck 2105 can also include an antenna 2113 for receiving data communication and connecting the immersion cooling system 2100 to a network. The truck 2105 can further include a heat vent 2110 for transferring heat outside the truck 2105 (e.g., if the immersion cooling system includes a condenser on the system). The immersion cooling system 2100 can be coupled to various springs 2112, which are located in between the platform 2111 and the immersion cooling system 2100. The springs 2112 can absorb some of the shocks that are transferred from the truck 2105 to the immersion cooling system 2100.

In one example, the immersion cooling system can be assembled in a container, which can be loaded onto a transportation vehicle, e.g., truck or boat. The immersion cooling system can be mounted on a platform. The container can include the immersion cooling system while loaded on the platform.

In some embodiments, the system can include one or more mechanisms to minimize fluid movement or undesired movement of other components such that movement of the system or system components does not significantly adversely affect computing or cooling performance. Such mechanisms include, for example, a gyro.

In the preceding specification, various embodiments have been described with references to the accompanying drawings. It will, however, be evident that various modifications and changes may be made thereto, and additional embodiments may be implemented, without departing from the broader scope of the invention as set forth in the claims that follow. The specification and drawings are accordingly to be regarded as an illustrative rather than restrictive sense.

What is claimed is:

1. A system comprising:
    a vessel configured to hold thermally conductive, condensable dielectric fluid;
    a computer component configured to be at least partially submerged within the dielectric fluid;
    a chassis configured to hold the computer component and the dielectric fluid; and
    a fluid circulation system configured to draw the dielectric fluid from a sump area of the vessel, pass the dielectric fluid through a filter and deliver the dielectric fluid to the chassis wherein the sump area comprises a side wall adjacent the chassis and a side portion of the vessel.

2. The system of claim 1, further comprising a fluid level sensor for determining a level of the dielectric fluid.

3. The system of claim 2, wherein the fluid level sensor is located in the chassis.

4. The system of claim 2, further comprising an inlet for receiving the dielectric fluid from a source outside of the vessel.

5. The system of claim 1, further comprising a plurality of sensors and a management system configured to:
    receive sensor data relating to the computer component; and
    determine a failure of the filter based on the sensor data.

6. The system of claim 5, wherein the sensor data includes: a temperature of the computer component, a power consumption at the vessel, an outside temperature, a dielectric fluid temperature, a temperature of incoming cooling medium, a temperature of outgoing cooling medium, a flow rate of a cooling medium, a temperature of an area above the bath area, a number of computer components present in the vessel, or a location of each computer component within the vessel.

7. The system of claim 5, wherein the management system is configured to determine whether the computer component is overheating using a machine learning model.

8. The system of claim 7, wherein the machine learning model is trained using the sensor data received from the vessel.

9. The system of claim 5, wherein the management system is further configured to receive temperature data.

10. The system of claim 9, wherein the management system is further configured to determine a state of operation of the vessel.

11. The system of claim 10, wherein, the state of operation is: 1) activation or deactivation of a heat exchanger; 2) dielectric fluid burning; and 3) dielectric fluid leaking.

12. The system of claim 10, wherein the management system is further configured to determine the state of operation of vessel using a machine learning model based on data received from the sensor and the temperature data.

13. The system of claim 1, wherein the vessel is protected by a secondary layer.

14. The system of claim 13, wherein the secondary layer is parallel to an internal layer and configured to receive leaked fluid from the internal layer.

15. The system of claim 14, wherein a fluid sensor is provided between the secondary layer and the internal layer to detect a level of the leaked fluids.

* * * * *